United States Patent
Kim et al.

(10) Patent No.: US 9,792,969 B1
(45) Date of Patent: Oct. 17, 2017

(54) SEMICONDUCTOR DEVICE AND SEMICONDUCTOR SYSTEM

(71) Applicant: SK hynix Inc., Gyeonggi-do (KR)

(72) Inventors: Hyun-Seung Kim, Gyeonggi-do (KR); Kwang-Soon Kim, Gyeonggi-do (KR); Seung-Wook Oh, Gyeonggi-do (KR); Jin-Youp Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/432,214

(22) Filed: Feb. 14, 2017

(30) Foreign Application Priority Data

Jul. 12, 2016 (KR) .................. 10-2016-0087945

(51) Int. Cl.
| | | |
|---|---|---|
| *G11C 7/10* | (2006.01) | |
| *G11C 7/22* | (2006.01) | |
| *G11C 7/14* | (2006.01) | |
| *G11C 7/12* | (2006.01) | |
| *G11C 7/20* | (2006.01) | |

(52) U.S. Cl.
CPC ................ *G11C 7/22* (2013.01); *G11C 7/10* (2013.01); *G11C 7/12* (2013.01); *G11C 7/14* (2013.01); *G11C 7/20* (2013.01)

(58) Field of Classification Search
CPC .... G11C 7/22; G11C 7/10; G11C 7/14; G11C 7/12; G11C 7/20
USPC .................. 365/189.05, 189.08, 189.09, 193
See application file for complete search history.

(56) References Cited

U.S. PATENT DOCUMENTS

| | | | | |
|---|---|---|---|---|
| 940,721 | A | * 11/1909 | Phillips | ................ B60P 1/12 298/19 R |
| 8,610,457 | B2 | 12/2013 | Jung | |
| 9,412,468 | B2 | 8/2016 | Ko | |
| 9,558,806 | B1 | * 1/2017 | Suwa | ................ G11C 11/4082 |
| 9,576,627 | B2 | * 2/2017 | Ko | .................... G11C 7/22 |
| 9,583,175 | B1 | * 2/2017 | Singh | ................ G11C 11/4093 |
| 2006/0149490 | A1 | * 7/2006 | Nam | .................... G11C 29/028 702/107 |
| 2007/0226429 | A1 | * 9/2007 | Dietrich | ............... G11C 7/1078 711/154 |
| 2011/0205832 | A1 | * 8/2011 | Jeon | ................ G11C 7/1057 365/233.16 |
| 2011/0218949 | A1 | * 9/2011 | Cho | .................... G06F 15/18 706/12 |
| 2011/0267117 | A1 | * 11/2011 | Choi | .................... H03L 7/00 327/156 |
| 2011/0267907 | A1 | * 11/2011 | Park | .................... G11C 7/04 365/193 |

(Continued)

*Primary Examiner* — Viet Q Nguyen
(74) *Attorney, Agent, or Firm* — IP & T Group LLP

(57) ABSTRACT

A semiconductor system includes a controller operatively coupled to a semiconductor device, the controller being suitable in a training mode for receiving an external signal and a first data signal from an external device and for transmitting the received external signal and the first data signal to the semiconductor device; and the semiconductor device being suitable in the training mode for determining a level of a reference voltage in response to the first data signal, and for transmitting a second data signal to the controller by buffering the external signal based on the reference voltage without performing a termination operation during an output period of the second data signal, wherein the controller controls an enable timing of the external signal by receiving the second data signal.

15 Claims, 15 Drawing Sheets

(56) References Cited

U.S. PATENT DOCUMENTS

| | | | |
|---|---|---|---|
| 2011/0307717 A1* | 12/2011 | Fox | G11C 29/02 |
| | | | 713/300 |
| 2011/0320867 A1* | 12/2011 | Chaudhuri | G06F 11/0793 |
| | | | 714/15 |
| 2013/0315014 A1* | 11/2013 | Dearth | G06F 13/1689 |
| | | | 365/193 |
| 2015/0095565 A1* | 4/2015 | Morris | G06F 13/1689 |
| | | | 711/109 |
| 2016/0041943 A1* | 2/2016 | Hollis | G06F 13/4243 |
| | | | 710/106 |
| 2017/0110175 A1* | 4/2017 | Kim | G11C 11/4093 |

* cited by examiner

US 9,792,969 B1

SEMICONDUCTOR DEVICE AND SEMICONDUCTOR SYSTEM

CROSS-REFERENCE TO RELATED APPLICATION

This application claims priority under 35 U.S.C. §119 to Korean Patent Application No. 10-2016-0087945 filed on Jul. 12, 2016 in the Korean Intellectual Property Office, the disclosure of which is Incorporated herein by reference in its entirety.

TECHNICAL FIELD

Exemplary embodiments relate generally to semiconductor technology and, more particularly, to a semiconductor device and a system which performs training between a controller and the semiconductor device.

DISCUSSION OF THE RELATED ART

Semiconductor devices, for example, semiconductor memory devices, are being developed continuously for improving their integration degree and operating speed. A synchronous memory device (SMD) is known in the art which operates in synchronization with a clock signal provided from an external device for improving the operating speed of the memory device.

Also, a DDR-SMD (double data rate SMD) is known which processes two data within one clock cycle. In each data input/output pin of a DDR-SMD, two data are inputted/outputted successively in synchronization with the rising edge and the falling edge of a clock signal inputted from an external device. Therefore, in a DDR-SMD, even though the frequency of a clock signal is not increased, a band width may be realized which is at least two times wider than the band width of a conventional SDR-SMD (Single data rate SMD). Accordingly, a DDR-SMD may realize a higher operating speed than a SDR-SMD.

In addition to high speed operation, it is also, generally desirable that a semiconductor device, such as a semiconductor memory device has a low power consumption. For example, a dynamic random access memory (DRAM) of a low power double data rate (LPDDR) specification is highly desirable. In a memory system, such as an LPDDR DRAM system, data are transmitted and received in both directions between a DRAM and a controller in synchronization with the rising edge and the falling edge of a clock signal at a low power condition.

However, as an operation frequency gradually increases under a low power condition of a memory system, a propagation delay may occur due to noise or a skew, whereby signal integrity may deteriorate. Therefore, a memory system needs to operate within an optimal signal window or compensate for a signal skew, through a training session between a controller and a memory device.

SUMMARY

Various embodiments are directed to a semiconductor device and a semiconductor system capable of controlling a termination operation in a training mode in which input/output of signals is implemented using the same pads.

In an embodiment, a semiconductor system may include: a controller operatively coupled to a semiconductor device; the controller being suitable in a training mode for receiving an external signal and a first data signal from an external device and for transmitting the received external signal and the first data signal to the semiconductor device; and the semiconductor device being suitable in the training mode for determining a level of a reference voltage in response to the first data signal, and for transmitting a second data signal to the controller by buffering the external signal based on the reference voltage without performing a termination operation during an output period of the second data signal, wherein the controller controls an enable timing of the external signal by receiving the second data signal.

In an embodiment, a semiconductor device may include: a reference voltage generation block suitable for determining a level of a reference voltage in response to a first data signal; a training block suitable for, in a training mode, buffering an external signal based on the reference voltage and outputting a training signal by latching a buffered external signal in response to a chip select signal; a timing control block suitable for, in the training mode, generating a cycle signal by receiving the chip select signal and generating an output timing signal which is enabled at a specified time, based on the cycle signal; an output control block suitable for, in the training mode, generating an output control signal of which enable period is determined according to the output timing signal; a termination control block suitable for, in the training mode, outputting a termination signal according to a termination control signal and controlling the termination signal such that a termination operation is not performed during the enable period of the output control signal; and an output driving block suitable for controlling output impedance according to the termination signal and outputting a second data signal by driving the training signal according to the output control signal.

According to the above embodiments, in a semiconductor device, the level of a reference voltage is set internally, training for an external signal including a command and an address is performed based on the set level of the reference voltage, and a termination operation is interrupted in a period in which the external signal is outputted, whereby it is possible to control the termination operation in a training mode.

BRIEF DESCRIPTION OF THE DRAWINGS

The above and other features and advantages of the present invention will become apparent to those skilled in the art to which the present invention pertains by the following detailed description with reference to the attached drawings in which.

DETAILED DESCRIPTION

Figure 1:
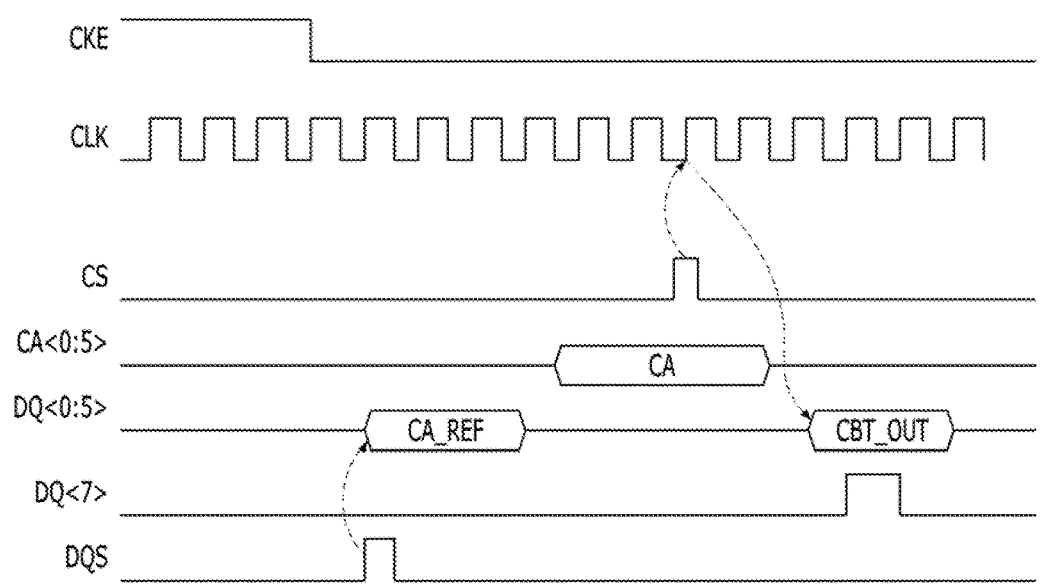
FIG. 1 is a timing diagram illustrating a training operation for a command/address signal in a command/address bus training (CBT) mode.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It is noted that the drawings are simplified schematics and as such are not necessarily drawn to scale. In some instances, various parts of the drawings may have been exaggerated in order to more clearly illustrate certain features of the illustrated embodiments.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

In a recent memory system which adopts a high speed addressing scheme of a double data rate (DDR) type, command signal input pins and address signal input pins which are respectively provided in a semiconductor memory device and a controller in the conventional art are used in common, and a command and an address may be inputted from a controller to a semiconductor memory device in synchronization with the rising edge and/or the falling edge of a clock signal. A signal which is used in common as a command signal and an address signal is referred to as a command/address signal.

In a memory system, by controlling a skew of a command/address signal through a command/address bus training (CBT) between a memory device and a controller, it is possible to perform transfer of a signal at a high speed. CBT refers to a technology of controlling a skew of a command/address signal by using a training pattern defined in advance between a controller and a memory device. When entry to the CBT mode is made, the memory device receives the reference value of the command/address signal from the controller, and sets the level of an internal reference voltage. Then, the memory device receives and buffers the command/address signal, and transmits a CBT result value to the controller. The controller may train the command/address signal based on the transmitted CBT result value.

FIG. 1 is a timing diagram illustrating a training operation for a command/address signal in a CBT mode.

Referring to FIG. 1, a training operation in an X8 CBT mode is shown. In the X8 CBT mode, a reference value CA_REF<0:5> of a command/address (CMD/ADDR) signal is received and a CBT result value CBT_OUT is transmitted, by using only one side byte, that is, upper data pads DQ<7:0>.

In the X8 CBT mode, a semiconductor memory device receives the reference value CA_REF<0:5> of the command/address signal transferred through first to sixth DQ pads DQ<0:5> in response to a strobe signal inputted through a DQS pad when a clock enable signal CKE transitions to a low level, and controls the level of a reference voltage (VREF_CA). Thereafter, when a command/address signal CA<0:5> is inputted, the semiconductor memory device buffers the command/address signal CA<0:5> based on the reference voltage (VREF_CA). If a chip select signal CS toggles in a state in which the clock enable signal CKE transitions to the low level, the semiconductor memory device recognizes the toggling at a point of time synchronized with a clock signal CLK, and outputs the CBT result value CBT_OUT through the first to sixth DQ pads DQ<0:5>. The CBT result value CBT_OUT is outputted through the first to sixth DQ pads DQ<0:5>, and data which toggles for a predetermined time is outputted through an eighth DQ pad DQ<7>. The data outputted through the eighth DQ pad DQ<7> may be used as a strobe signal which notifies that the data outputted through the first to sixth DQ pads DQ<0:5> is valid data.

Accordingly, a controller may train the command/address signal based on the CBT result value CBT_OUT received therein. In other words, the controller may control the timing of the command/address signal through a training operation so that the middle of the valid window of the command/address signal is positioned at the intersection of the rising edge and the falling edge of a pair of clock signals. Thus, the timing margin of the command/address signal may be maximized securely.

A semiconductor memory device ensures smooth transmission of signals between devices, by employing an on-die termination (ODT) operation according to the specification prescribed in a Joint Electron Device Engineering Council (JEDEC) protocol. Generally, an ODT operation refers to an operation of controlling the resistance of a termination terminal by adjusting the number of transistors to be turned on among a plurality of transistors coupled in parallel, to make the resistance of the termination terminal equal to an external reference resistance. Currently, in existing semiconductor memory devices, an ODT operation is not controlled in the X8 CBT mode in which an input operation of the reference value CA_REF of the command/address (CMD/ADDR) signal and an output operation of the CBT result value CBT_OUT are performed through the same pads. Therefore, it is difficult to precisely perform a training operation in the X8 CBT mode.

Hereafter, according to an embodiment of the present disclosure, a semiconductor system is provided that is capable of controlling a termination operation in a training mode in which input/output of signals are transmitted by using the same pads (that is, the same data bus).

Figure 2:
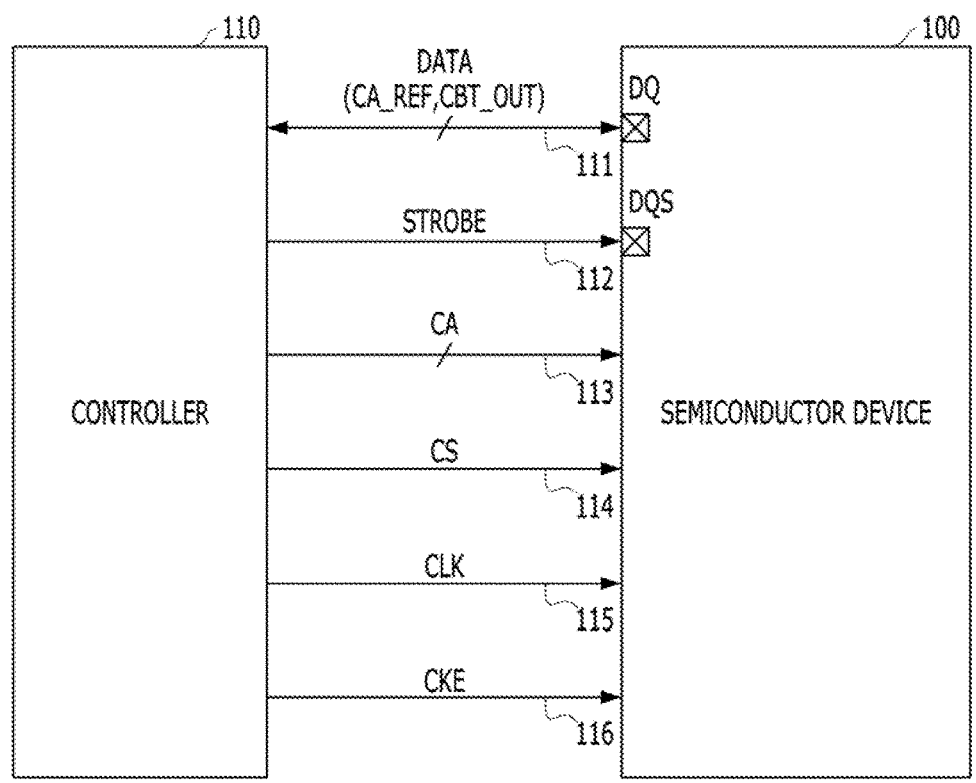
FIG. 2 is a block diagram illustrating a semiconductor system, in accordance with an embodiment of the present invention.

FIG. 2 is a block diagram illustrating a semiconductor system, in accordance with an embodiment of the present invention.

Referring to FIG. 2, the semiconductor system may include a semiconductor device 100 and a controller 110. In a training mode, the controller 110 may transmit to the semiconductor device 100 a command/address signal CA and a first data signal CA_REF which are inputted from an external device, receive a second data signal CBT_OUT from the semiconductor memory device 100 and control the enable timing of the command/address signal CA. The semiconductor device 100 may set the level of a reference voltage VREF_CA (not shown) therein in response to the first data signal CA_REF, buffer the command/address signal CA based on the reference voltage VREF_CA and output the second data signal CBT_OUT. At this time, in the semiconductor device 100 in accordance with the embodiment, in a period in which the second data signal CBT_OUT is outputted, a termination operation is not performed so that a data output operation may be precisely implemented. In an embodiment, the semiconductor device 100 may include a semiconductor memory device.

Between the controller 110 and the semiconductor device 100, there may be coupled a data bus 111 through which the first data signal CA_REF and the second data signal CBT_OUT are exchanged in the training mode, a strobe signal (STROBE) line 112, a command/address bus 113, a chip select signal (CS) line 114, a clock signal (CLK) line 115, and a clock enable signal (CKE) line 116.

A clock signal CLK generated from the controller 110 is provided to the semiconductor device 100 through the clock signal line 115. The clock signal CLK may be provided together with an inverted clock signal CLKB, as a successively alternating inverted signal. The pair of clock signals CLK and CLKB may improve timing precision because rising and falling edges may be detected based on the intersections thereof. For avoiding unnecessary duplication, the pair of clock signals CLK and CLKB will be described as the clock signal CLK.

A command/address signal CA generated from the controller 110 is provided to the semiconductor device 100 through the command/address bus 113. A command signal or an address signal of the semiconductor device 100 may be loaded on the command/address bus 113. The controller 110 may transmit a mode register (MRS) command which instructs entry to a command/address bus training (CBT) mode, through the command/address bus 113. The MRS command includes a CBT mode entry command and a CBT mode exit command. Through the command/address bus 113, a start signal which represents the CBT mode entry command may be transmitted or an end signal which represents the CBT mode exit command may be transmitted.

The data bus 111 may transmit and receive data signals between the controller 110 and the semiconductor device 100. Also, in the training mode, the data bus 111 may transmit the first data signal CA_REF corresponding to the reference value of the command/address signal CA, to the semiconductor device 100, and transmit the second data signal CBT_OUT corresponding to the result value of the command/address bus training (CBT) performed in the semiconductor device 100, to the controller 110 from the semiconductor device 100.

The data bus 111 may be coupled with the data (DQ) pads of the semiconductor device 100, and the strobe signal line 112 may be coupled with the DQS pad of the semiconductor device 100. The data (DQ) pads may include upper data pads DQ<7:0> and lower data pads DQ<15:8>. In an X8 CBT mode, in the semiconductor device 100, a reference value CA_REF<0:5> of a command/address signal is received and a CBT result value CBT_OUT is transmitted, by using only the upper data (DQ) pads DQ<7:0>. Mapping between the second data signal CBT_OUT and DQ pads may be set variously. For example, in the X8 CBT mode, the reference value CA_REF<0:5> of the command/address signal is received and the CBT result value CBT_OUT<0:5> is transmitted through first to sixth DQ pads DQ<0:5> among the upper DQ pads DQ<7:0>, and a strobe signal which notifies that the data outputted through the first to sixth DQ pads DQ<0:5> is valid data may be outputted through an eighth DQ pad DQ<7>.

In the semiconductor system configured as mentioned above, in the training mode, the controller 110 may transmit the command/address signal CA to the semiconductor device 100 through the command/address bus 113, and transmit the first data signal CA_REF to the semiconductor device 100 through the data bus 111. The semiconductor device 100 may set the level of the reference voltage VREF_CA therein in response to the first data signal CA_REF inputted through the DQ pads, buffer the command/address signal CA based on the reference voltage VREF_CA and output the second data signal CBT_OUT back to the controller 110 through the DQ pads. During a period in which the second data signal CBT_OUT is transmitted to the controller 110 the semiconductor device 100 does not perform a termination operation for the DQ pads. Therefore, in the X8 CBT mode in which an input operation of the reference value CA_REF of the command/address signal and an output operation of the CBT result value CBT_OUT are performed through using the same pads, by controlling an ODT operation, it is possible to precisely perform a training operation.

Hereafter, a detailed configuration of the semiconductor device 100 which controls the ODT operation in the X8 CBT mode will be described with reference to the drawings.

Figure 3:
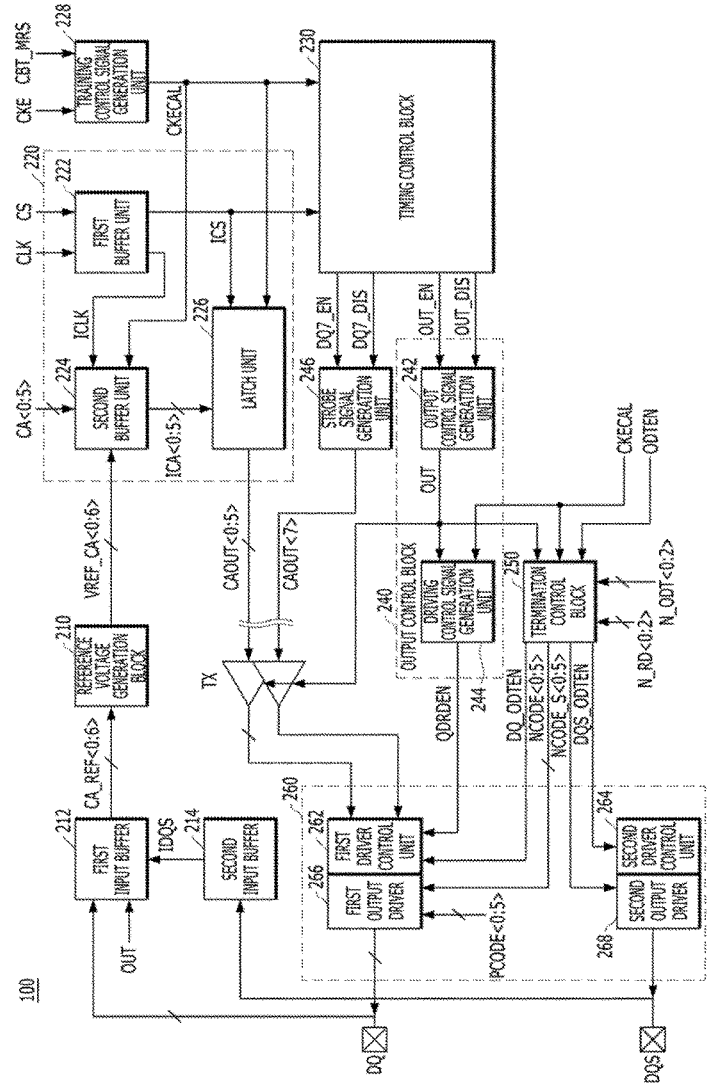
FIG. 3 is a detailed configuration diagram illustrating a semiconductor device, in accordance with an embodiment of the present invention.

FIG. 3 is a detailed configuration diagram illustrating the semiconductor device 100 in accordance with an embodiment of the present invention.

Referring to FIG. 3, the semiconductor device 100 may include a reference voltage generation block 210, a training block 220, a timing control block 230, an output control block 240, a termination control block 250, and an output driving block 260.

The reference voltage generation block 210 may set the level of a reference voltage VREF_CA<0:6> in response to a first data signal CA_REF<0:6> transferred through the data bus 111 (see FIG. 2) from the controller 110 (see FIG. 2).

More specifically, the semiconductor device 100 may include a first input buffer 212 for buffering the data inputted through the DQ pads and transmitting the first data signal CA_REF<0:6> to the reference voltage generation block 210. The semiconductor device 100 may further include a second input buffer 214 for buffering a strobe signal inputted through a DQS pad and transmitting an internal strobe signal IDQS to the first input buffer 212. The first input buffer 212 may be controlled to receive the data inputted through the DQ pads, in response to the internal strobe signal IDQS, and to be disabled in response to an output control signal OUT.

The training block 220 may buffer a command/address signal CA<0:5> transferred through the command/address bus 113 (see FIG. 2) from the controller 110, based on the reference voltage VREF_CA<0:6>, and output an internal command/address signal ICA<0:5>. The training block 220 may latch the internal command/address signal ICA<0:5> in response to a chip select signal CS and a training control signal CKECAL, and output a training signal CAOUT<0:5>.

In detail, the training block 220 may include a first buffer unit 222, a second buffer unit 224, and a latch unit 226.

The first buffer unit 222 may buffer a clock signal CLK received from the controller 110 (see FIG. 2) and output an internal clock signal ICLK to the second buffer 224. The first buffer unit 222 may also output an internal chip select signal ICS to the latch unit 226 by synchronizing the chip select signal CS (received from the controller 110, see FIG. 2) with the rising edge or the falling edge of the internal clock signal ICLK. The second buffer unit 224 may be enabled when the training control signal CKECAL is enabled, generate the internal command/address signal ICA<0:5> by buffering the command/address signal CA<0:5> based on the reference voltage VREF_CA<0:6>, and output the generated internal command/address signal ICA<0:5> in synchronization with the internal clock signal ICLK. The latch unit 226 may be enabled when the training control signal CKECAL is enabled, and latch the internal command/address signal ICA<0:5> according to the internal chip select signal ICS and output the training signal CAOUT<0:5>.

For reference, the semiconductor device 100 may further include a training control signal generation unit 228 which generates the training control signal CKECAL. The training control signal generation unit 228 may generate the training control signal CKECAL in response to a training mode signal CBT_MRS transferred from a mode register (MRS) (not shown) and a clock enable signal CKE received from the controller 110 (see FIG. 2). The training control signal generation unit 228 may enable and output the training control signal CKECAL when the training mode signal CBT_MRS and the clock enable signal CKE are enabled. For reference, the mode register (MRS) may generate the training mode signal CBT_MRS by receiving a mode register (MRS) command which is transferred through the command/address bus 113 from the controller 110 and instructs entry to a command/address bus training (CBT) mode.

The timing control block 230 may receive the internal chip select signal ICS and the training control signal CKECAL, generate a cycle signal OSC_OUT (see FIG. 8), and generate first and second output timing signals OUT_EN and OUT_DIS and first and second strobe timing signals DQ7_EN and DQ7_DIS which are enabled at specified times, based on the cycle signal OSC_OUT. The timing control block 230 may generate a plurality of counting signals (not shown) by counting the cycle signal OSC_OUT, and generate the first and second output timing signals OUT_EN and OUT_DIS and the first and second strobe timing signals DQ7_EN and DQ7_DIS which are enabled at the enable time of at least one signal among the cycle signal OSC_OUT and the plurality of counting signals.

The output control block 240 may generate the output control signal OUT of which enable period is determined according to the first and second output timing signals OUT_EN and OUT_DIS. Also, the output control block 240 may output the output control signal OUT as a driving control signal QDRDEN according to the training control signal CKECAL.

In detail, the output control block 240 may include an output control signal generation unit 242 and a driving control signal generation unit 244.

The output control signal generation unit 242 may generate the output control signal OUT which is enabled according to the first output timing signal OUT_EN and is disabled according to the second output timing signal OUT_DIS. The driving control signal generation unit 244 may be enabled when the training control signal CKECAL is enabled, and output the output control signal OUT as the driving control signal QDRDEN to the output driving block 260. In an embodiment, the driving control signal generation unit 244 may be implemented by an AND gate which receives the training control signal CKECAL and the output control signal OUT of the output control signal generation unit 242.

For reference, the semiconductor device 100 may additionally include a strobe signal generation unit 246 for generating a training signal CAOUT<7> which is transmitted to an eighth DQ pad DQ<7> in a training mode. The strobe signal generation unit 246 may control the enable period of the training signal CAOUT<7> according to the first and second strobe timing signals DQ7_EN and DQ7_DIS. The strobe signal generation unit 246 may generate the training signal CAOUT<7> which is enabled according to the first strobe timing signal DQ7_EN and is disabled according to the second strobe timing signal DQ7_DIS. The training signal CAOUT<7> as a signal toggling for a period in which the training signal CAOUT<0:5> is outputted from the training block 220 to first to sixth DQ pads DQ<0:5>, that is, for a predetermined time, may be used as a strobe signal which notifies the controller that the data outputted to the first to sixth DQ pads DQ<0:5> is valid data.

The termination control block 250 may output a termination signal according to the training control signal CKECAL and a termination control signal ODTEN, and control the termination signal so that a termination operation is not performed during the enable period of the output control signal OUT. The termination signal may include a pull-up impedance control code PCODE<0:5> and/or a pull-down impedance control code NCODE<0:5>.

In general, if the termination control signal ODTEN is enabled, the pull-down impedance control code NCODE<0:5> for pulling down DQ pads or the pull-up impedance control code PCODE<0:5> for pulling up the DQ pads is inputted. According to this fact, the output driving block 260 may perform the termination operation by pulling down or pulling up the DQ pads with preset impedance. In the embodiment of the present disclosure, even though the termination control signal ODTEN is enabled, during the enable period of the output control signal OUT, that is, during a period in which the training signal CAOUT<0:5> is outputted to the first to sixth DQ pads DQ<0:5>, both the pull-up impedance control code PCODE<0:5> and the pull-down impedance control code NCODE<0:5> are received such that the termination operation is not performed. That is to say, during the period in which the training signal CAOUT<0:5> is outputted, even though the termination control signal ODTEN is enabled, the output driving block 260 of the semiconductor device 100 may drive the training signal CAOUT<0:5> according to the pull-up impedance control code PCODE<0:5> and the pull-down impedance control code NCODE<0:5> such that the training signal CAOUT<0:5> is outputted to the DQ pads.

The termination control block 250 shown in FIG. 3, in accordance with an embodiment of the present invention outputs a first termination enable signal DQ_ODTEN and a second termination enable signal DQS_ODTEN according to the training control signal CKECAL and the termination control signal ODTEN. Also, the termination control block 250 may output the pull-down impedance control code NCODE<0:5> according to the training control signal CKE-CAL and the termination control signal ODTEN. During the enable period of the output control signal OUT, the termination control block 250 may output not a signal NCODE_ODT<0:5> (not shown in FIG. 3, in accordance to an embodiment of the present invention) obtained by decoding a pull-down impedance control code N_ODT<0:2> for termination but a signal NCODE_RD<0:5> (not shown in FIG. 3, in accordance to an embodiment of the present invention) obtained by decoding a pull-down impedance control code N_RD<0:2> for read operation, as the pull-down impedance control code NCODE<0:5>. While it is illustrated in the embodiment of FIG. 3 that the pull-down impedance control code NCODE<0:5> for pulling down the DQ pads in the termination operation is inputted, it is to be noted that the embodiment is not limited thereto. In other words, in the termination operation, the pull-up impedance control code PCODE<0:5> for pulling up the DQ pads or both the pull-up impedance control code PCODE<0:5> and the pull-down impedance control code NCODE<0:5> may be inputted.

The output driving block 260 may control output impedance according to the pull-up impedance control code PCODE<0:5> and the pull-down impedance control code NCODE<0:5> when the first termination enable signal DQ_ODTEN and the second termination enable signal DQS_ODTEN are enabled, output a second data signal CBT_OUT<0:5> to the first to sixth DQ pads DQ<0:5> by driving the training signal CAOUT<0:5> according to the driving control signal QDRDEN, and output the strobe signal to the eighth DQ pad DQ<7> by driving the training signal CAOUT<7>. Namely, while outputting the second data signal CBT_OUT<0:5> to the first to sixth DQ pads DQ<0:5> by driving the training signal CAOUT<0:5> according to the driving control signal QDRDEN, the output driving block 260 may output the training signal CAOUT<7> outputted from the strobe signal generation unit 246 to one among upper data (DQ) pads DQ<7:0>, for example, the eighth DQ pad DQ<7>.

In detail, the output driving block 260 may include a first driver control unit 262, a second driver control unit 264, a first output driver 266, and a second output driver 268.

The first driver control unit 262 may drive the training signals CAOUT<0:5, 7> as pull-up training signals CAOUT_UP<0:5, 7> and pull-down training signals CAOUT_DN<0:5, 7> according to the first termination enable signal DQ_ODTEN and the driving control signal QDRDEN.

The first driver control unit 262 may drive the pull-up training signals CAOUT_UP<0:5, 7> and the pull-down training signals CAOUT_DN<0:5, 7> according to the first termination enable signal DQ_ODTEN when the driving control signal QDRDEN is disabled. At this time, the first driver control unit 262 outputs both the pull-up training signals CAOUT_UP<0:5, 7> and the pull-down training signals CAOUT_DN<0:5, 7> by sticking them to low logic levels when the first termination enable signal DQ_ODTEN is disabled such that the DQ pads are driven to a high impedance (high-Z) state, and outputs the pull-up training signals CAOUT_UP<0:5, 7> to the low logic level and outputs the pull-down training signals CAOUT_DN<0:5, 7> to a high logic level when the first termination enable signal DQ_ODTEN is enabled such that the DQ pads are pull-down terminated.

Conversely, if the driving control signal QDRDEN is enabled, the first driver control unit 262 may output the training signals CAOUT<0:5, 7> as the pull-up training signals CAOUT_UP<0:5, 7> and output the inverted signals of the training signals CAOUT<0:5, 7> as the pull-down training signals CAOUT_DN<0:5, 7>, regardless of the first termination enable signal DQ_ODTEN. According to this fact, a normal data output operation may be performed. Therefore, in the embodiment of the present disclosure, even though the first termination enable signal DQ_ODTEN is enabled in the training mode, the termination operation may not be performed and the normal data output operation may be performed during the enable period of the driving control signal QDRDEN, that is, during the period in which the training signal CAOUT<0:5> is outputted to the first to sixth DQ pads DQ<0:5>.

The first output driver 266 may control output impedance according to the pull-up impedance control code PCODE<0:5> and the pull-down impedance control code NCODE<0:5>, and receive the pull-up training signals CAOUT_UP<0:5, 7> and the pull-down training signals CAOUT_DN<0:5, 7> and output the second data signal CBT_OUT<0:5> and the strobe signal to the DQ pads.

The second driver control unit 264 may control the second output driver 268 to perform the termination operation for the DQS pad, according to the second termination enable signal DQS_ODTEN. Since the DQS pad is used in only an input mode in which the strobe signal is inputted through the strobe signal line 112 (see FIG. 2), the termination control block 250 may output a pull-down impedance control code NCODE_S<0:5> for termination, for terminating the DQS pad, and the second driver control unit 264 may control the second output driver 268 to perform the termination operation for the DQS pad according to the pull-down impedance control code NCODE_S<0:5> for termination, when the second termination enable signal DQS_ODTEN is enabled.

For reference, the semiconductor device 100 may additionally include internal transmitters TX which receive the training signal CAOUT<0:5> outputted from the latch unit 226 of the training block 220 and the training signal CAOUT<7> outputted from the strobe signal generation unit 246 and transfer them to the output driving block 260. The transmitters TX may transfer the training signals CAOUT<0:5, 7> inputted thereto, to the output driving block 260, in response to the output control signal OUT.

As described above, according to the embodiment of the present disclosure, during the period in which the training signal CAOUT<0:5> is outputted in the training mode, even though the termination control signal ODTEN is enabled, the output driving block 260 of the semiconductor device 100 does not perform the termination operation and performs the normal data output operation by driving the training signal CAOUT<0:5> and outputting them to the DQ pads.

Figure 4:
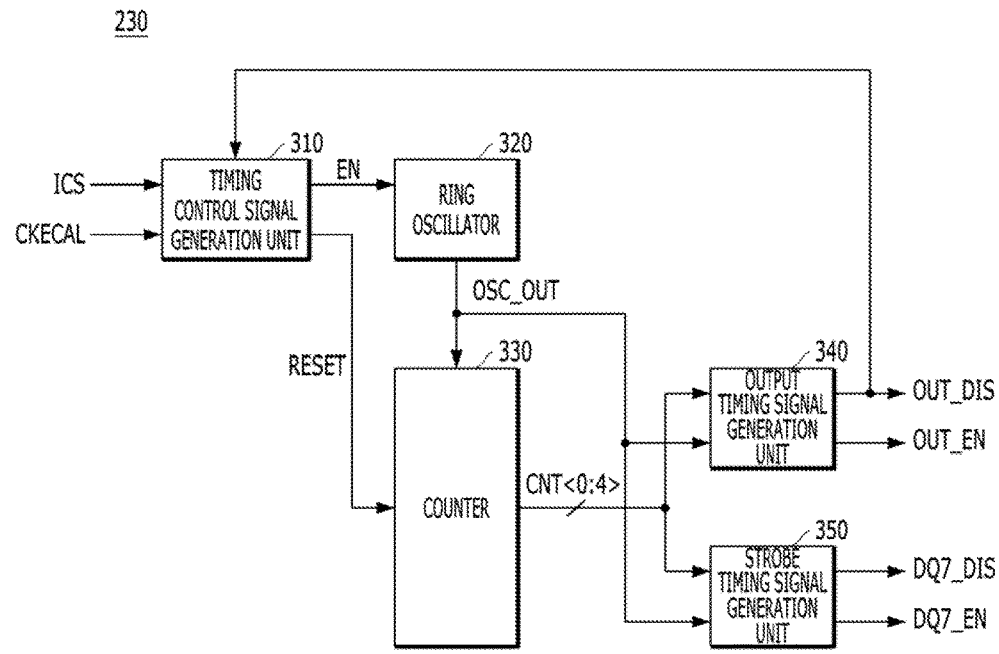
FIG. 4 is an internal configuration diagram illustrating a timing control block shown in FIG. 3, in accordance to an embodiment of the present invention.

FIG. 4 is an internal configuration diagram illustrating the timing control block 230 shown in FIG. 3, in accordance to an embodiment of the present invention.

Referring to FIG. 4, the timing control block 230 may include a timing control signal generation unit 310, a ring oscillator 320, a counter 330, an output timing signal generation unit 340, and a strobe timing signal generation unit 350.

The timing control signal generation unit 310 may generate an enable period signal EN and an initialization signal RESET in response to the internal chip select signal ICS and the second output timing signal OUT_DIS when the training control signal CKECAL is enabled. The ring oscillator 320 may generate the cycle signal OSC_OUT which cyclically toggles during the enable period of the enable period signal EN. The counter 330 may be initialized according to the initialization signal RESET, count the cycle signal OSC_OUT and generate first to fifth counting signals CNT<0:4> which have different cycles. A first counting signal CNT<0> may be generated to have a cycle two times longer than the cycle signal OSC_OUT. A second counting signal CNT<1> may be generated to have a cycle two times longer the first counting signal CNT<0>. A third counting signal CNT<2> may be generated to have a cycle two times longer the second counting signal CNT<1>. A fourth counting signal CNT<3> may be generated to have a cycle two times longer the third counting signal CNT<2>. A fifth counting signal CNT<4> may be generated to have a cycle two times longer the fourth counting signal CNT<3>.

The output timing signal generation unit 340 may generate the first and second output timing signals OUT_EN and OUT_DIS which are enabled at specified times, based on the cycle signal OSC_OUT and the first to fifth counting signals CNT<0:4>. The strobe timing signal generation unit 350 may generate the first and second strobe timing signals DQ7_EN and DQ7_DIS which are enabled at specified times, based on the cycle signal OSC_OUT and the first to fifth counting signals CNT<0:4>.

Figure 5A:
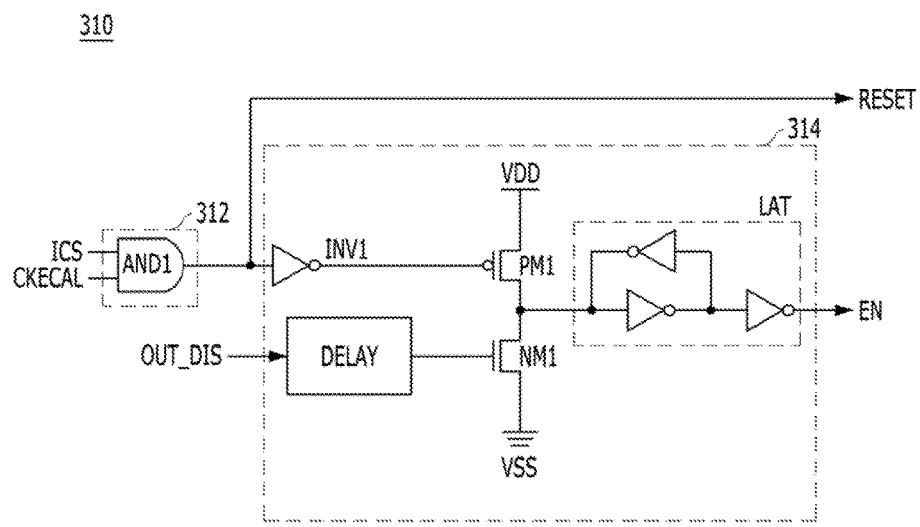
FIGS. 5A and 5B are a detailed circuit diagram and an operation waveform diagram illustrating a timing control signal generation unit shown in FIG. 4, respectively.
Figure 5B:
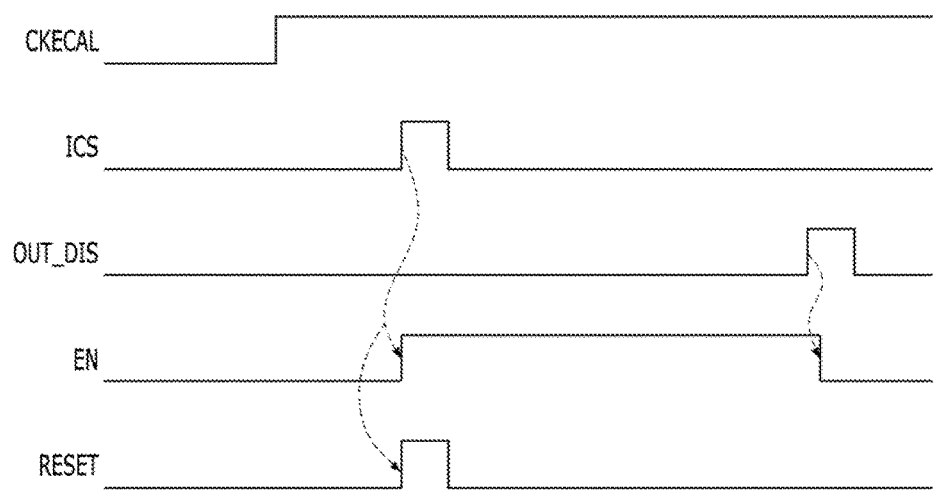

FIGS. 5A and 5B are a detailed circuit diagram and an operation waveform diagram illustrating the timing control signal generation unit 310 shown in FIG. 4, respectively, in accordance to an embodiment of the present invention.

Referring to FIG. 5A, the timing control signal generation unit 310 may include an initialization signal generation section 312 and an enable period signal generation section 314.

The initialization signal generation section 312 may generate the initialization signal RESET which is enabled in response to the internal chip select signal ICS, when the training control signal CKECAL is enabled. In an embodiment, the initialization signal generation section 312 may be configured by an AND gate AND1 which receives the training control signal CKECAL and the internal chip select signal ICS and outputs the initialization signal RESET.

The enable period signal generation section 314 may include an inverter INV1, a delay DELAY, a PMOS transistor PM1, an NMOS transistor NM1, and a latch LAT. The inverter INV1 receives the initialization signal RESET. The delay DELAY delays the second output timing signal OUT_DIS by a preselected time. The PMOS transistor PM1 and the NMOS transistor NM1 are coupled in series between the terminal of a power supply voltage VDD and the terminal of a ground voltage VSS and respectively receive the output of the inverter INV1 and the output of the delay DELAY through the gates thereof. The latch LAT latches the signal of the common node of the PMOS transistor PM1 and the NMOS transistor NM1 and outputs the enable period signal EN.

Accordingly, referring to FIG. 5B, the initialization signal generation section 312 may generate the initialization signal RESET as a pulse signal which pulses for a predefined period according to the internal chip select signal ICS, when the training control signal CKECAL is enabled. The enable period signal generation section 314 may generate the enable period signal EN which is enabled in response to the internal chip select signal ICS and is disabled in response to the second output timing control signal OUT_DIS, when the training control signal CKECAL is enabled.

Figure 6:
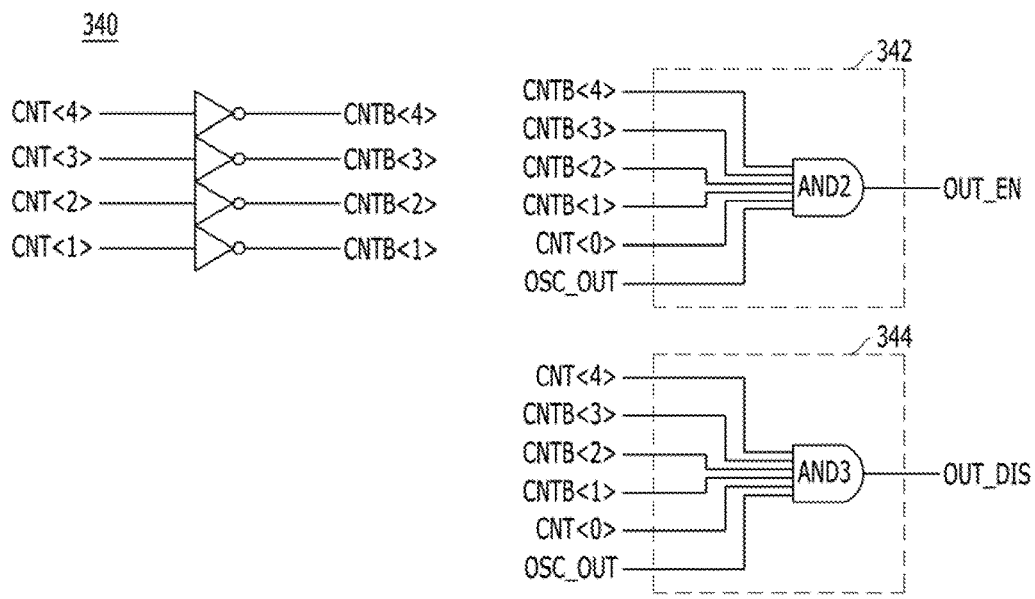
FIG. 6 is a circuit diagram illustrating an output timing signal generation unit shown in FIG. 4.

FIG. 6 is a circuit diagram illustrating the output timing signal generation unit 340 shown in FIG. 4, in accordance to an embodiment of the present invention.

Referring to FIG. 6, the output timing signal generation unit 340 may include a first signal generation section 342 and a second signal generation section 344.

The first signal generation section 342 may receive the cycle signal OSC_OUT, the first counting signal CNT<0>, an inverted signal CNTB<1> of the second counting signal CNT<1>, an inverted signal CNTB<2> of the third counting signal CNT<2>, an inverted signal CNTB<3> of the fourth counting signal CNT<3> and an inverted signal CNTB<4> of the fifth counting signal CNT<4>, and generate the first output timing signal OUT_EN. The second signal generation section 344 may receive the cycle signal OSC_OUT, the first counting signal CNT<0>, the inverted signal CNTB<1> of the second counting signal CNT<1>, the inverted signal CNTB<2> of the third counting signal CNT<2>, the inverted signal CNTB<3> of the fourth counting signal CNT<3> and the fifth counting signal CNT<4>, and generate the second output timing signal OUT_DIS. In an embodiment, the first signal generation section 342 and the second signal generation section 344 may be configured by AND gates AND2 and AND3, respectively.

Figure 7:
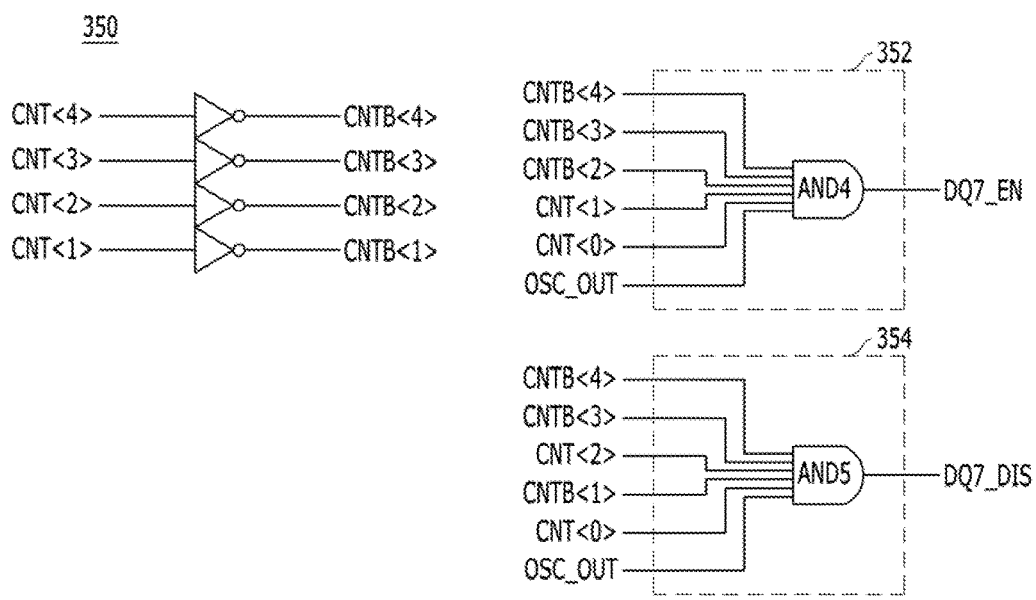
FIG. 7 is a circuit diagram illustrating a strobe timing signal generation unit shown in FIG. 4.

FIG. 7 is a circuit diagram illustrating the strobe timing signal generation unit 350 shown in FIG. 4, in accordance to an embodiment of the present invention.

Referring to FIG. 7, the strobe timing signal generation unit 350 may include a third signal generation section 352 and a fourth signal generation section 354.

The third signal generation section 352 may receive the cycle signal OSC_OUT, the first counting signal CNT<0>, the second counting signal CNT<1>, the inverted signal CNTB<2> of the third counting signal CNT<2>, the inverted signal CNTB<3> of the fourth counting signal CNT<3> and the inverted signal CNTB<4> of the fifth counting signal CNT<4>, and generate the first strobe timing signal DQ7_EN. The fourth signal generation section 354 may receive the cycle signal OSC_OUT, the first counting signal CNT<0>, the inverted signal CNTB<1> of the second counting signal CNT<1>, the third counting signal CNT<2>, the inverted signal CNTB<3> of the fourth counting signal CNT<3> and the inverted signal CNTB<4> of the fifth counting signal CNT<4>, and generate the second strobe timing signal DQ7_DIS. In an embodiment, the third signal generation section 352 and the fourth signal generation section 354 may be configured by AND gates AND4 and AND5, respectively.

Figure 8:
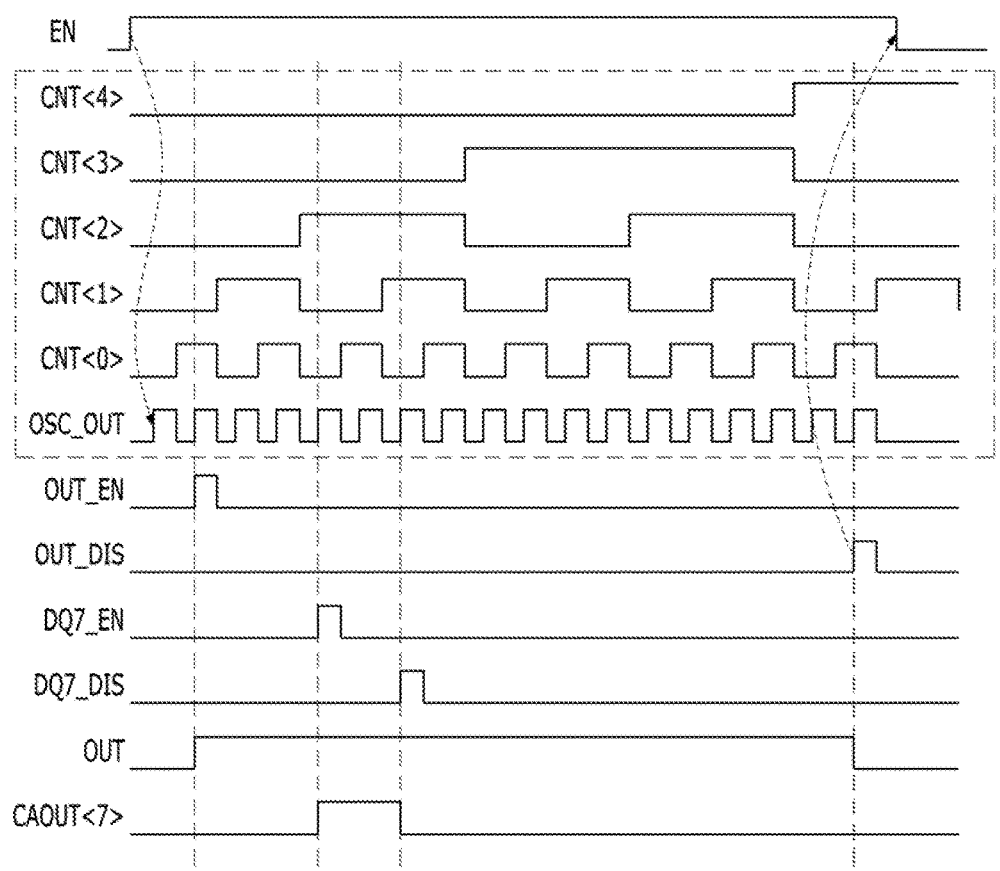
FIG. 8 is a waveform diagram illustrating an operation of the timing control block shown in FIG. 4.

FIG. 8 is a waveform diagram illustrating an operation of the timing control block 230 shown in FIG. 4, in accordance to an embodiment of the present invention.

Referring to FIG. 8, the ring oscillator 320 of the timing control block 230 generates the cycle signal OSC_OUT which cyclically toggles during the enable period of the enable period signal EN, and the counter 330 counts the cycle signal OSC_OUT and generates the first to fifth counting signals CNT<0:4> which have different cycles.

The output timing signal generation unit 340 generates the first output timing signal OUT_EN and the second output timing signal OUT_DIS. The first output timing signal OUT_EN is enabled in a period in which only the cycle signal OSC_OUT and the first counting signal CNT<0> are enabled. The second output timing signal OUT_DIS is enabled in a period in which only the cycle signal OSC_OUT, the first counting signal CNT<0> and the fifth counting signal CNT<4> are enabled. The strobe timing signal generation unit 350 generates the first strobe timing signal DQ7_EN and the second strobe timing signal DQ7_DIS. The first strobe timing signal DQ7_EN is enabled in a period in which only the cycle signal OSC_OUT, the first counting signal CNT<0> and the second counting signal CNT<1> are enabled. The second strobe timing signal DQ7_DIS is enabled in a period in which only the cycle signal OSC_OUT, the first counting signal CNT<0> and the third counting signal CNT<2> are enabled.

Thereafter, the timing control signal generation unit 310 may disable the enable period signal EN when the preselected time passes after the second output timing signal OUT_DIS is enabled.

Figure 9A:
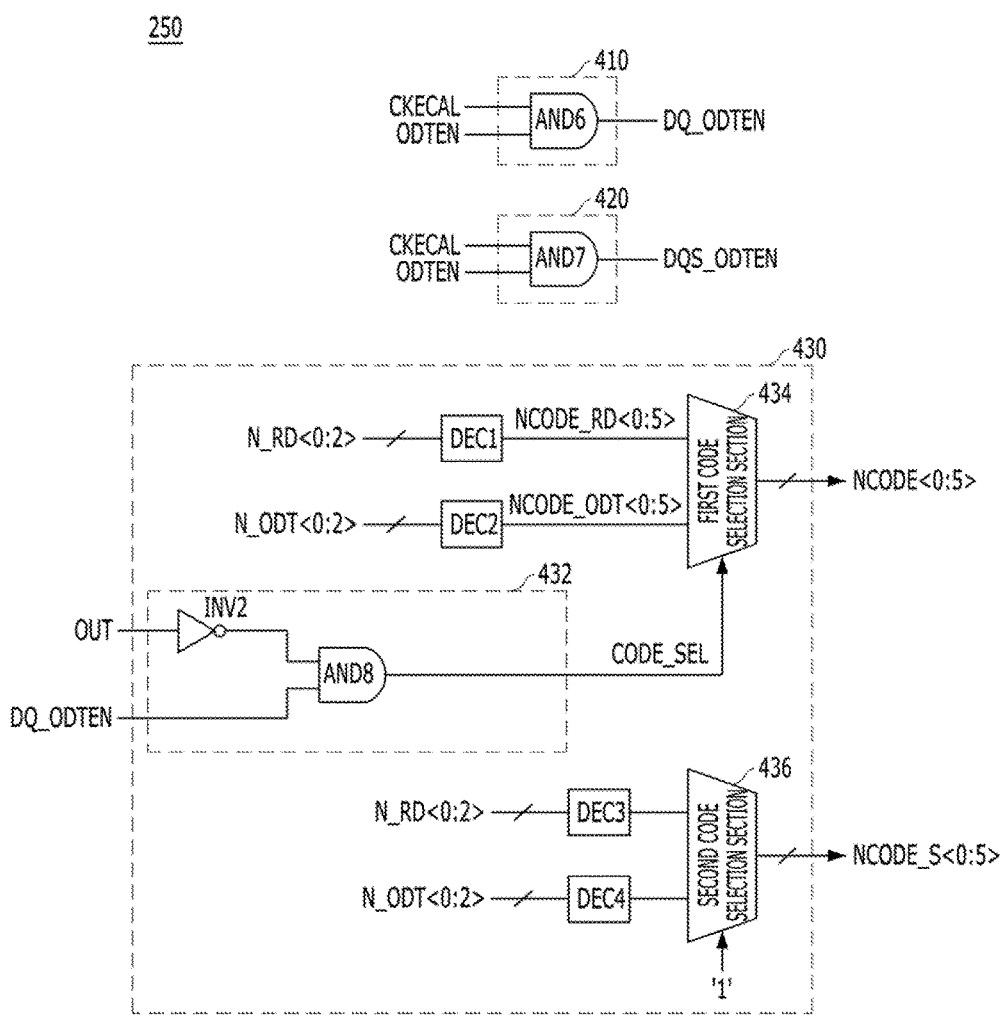
FIGS. 9A and 9B are a detailed circuit diagram and an operation waveform diagram illustrating a termination control block shown in FIG. 3, in accordance to an embodiment of the present invention, respectively.
Figure 9B:
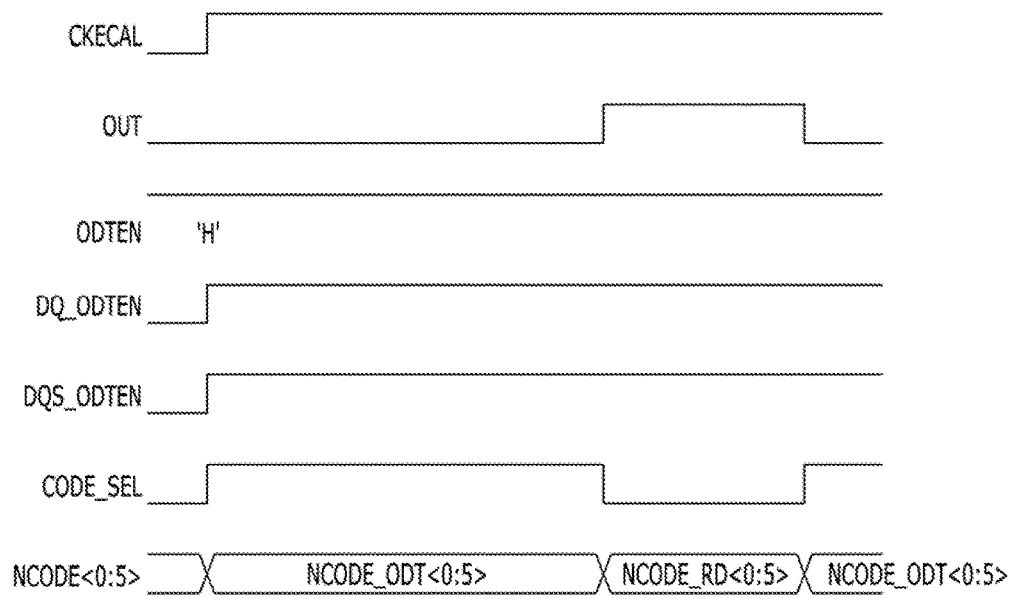

FIGS. 9A and 9B illustrate a detailed circuit diagram and an operation waveform diagram, respectively, of the termination control block 250 shown in FIG. 3, in accordance to an embodiment of the present invention.

Referring to FIG. 9A, the termination control block 250 may include a first termination enable signal generation unit 410, a second termination enable signal generation unit 420, and an impedance control code generation unit 430.

The first and second termination enable signal generation units 410 and t 420 may output the termination control signal ODTEN as the first termination enable signal DQ_ODTEN and the second termination enable signal DQS_ODTEN, respectively, when the training control signal CKECAL is enabled. In the illustrated embodiment of FIG. 9A, the first and second termination enable signal generation units 410 and 420 may be configured by AND gates AND6 and AND7, respectively. However, the invention is not limited in this way. For example, the first and second termination enable signal generation units 410 and 420 may be configured by a single signal generation section.

The impedance control code generation unit 430 may output the signal NCODE_ODT<0:5> as the pull-down impedance control code NCODE<0:5> and output the signal NCODE_RD<0:5> as the pull-down impedance control code NCODE<0:5>. The signal NCODE_ODT<0:5> is obtained by decoding the pull-down impedance control code N_ODT<0:2> for termination, as the pull-down impedance control code NCODE<0:5>, according to the first termination enable signal DQ_ODTEN. The signal NCODE_RD<0:5> is obtained by decoding the pull-down impedance control code N_RD<0:2> for read operation, as the pull-down impedance control code NCODE<0:5>, during the enable period of the output control signal OUT. Further, the impedance control code generation unit 430 may output the pull-down impedance control code NCODE_S<0:5> for termination, for terminating the DQS pad.

In detail, the impedance control code generation unit 430 may include a select signal generation section 432, a first code selection section 434, and a second code selection section 436.

The select signal generation section 432 may generate a select signal CODE_SEL which is enabled according to the first termination enable signal DQ_ODTEN and is disabled when the output control signal OUT is enabled. In the Illustrated embodiment, the select signal generation section 432 may include an inverter INV2 which receives the output control signal OUT, and an AND gate AND8 which receives the output of the inverter INV2 and the first termination enable signal DQ_ODTEN and outputs the select signal CODE_SEL. However, it is noted that the invention is not limited in this way and any other suitable configuration may be employed.

The first code selection section 434 may output the pull-down impedance control code NCODE<0:5> by selecting the signal NCODE_RD<0:5> obtained by decoding the pull-down impedance control code N_RD<0:2> for read operation or the signal NCODE_ODT<0:5> obtained by decoding the pull-down impedance control code N_ODT<0:2> for termination, in response to the select signal CODE_SEL. The first code selection section 434 may output the signal NCODE_RD<0:5> obtained by decoding the pull-down impedance control code N_RD<0:2> for read operation, as the pull-down impedance control code NCODE<0:5>, when the select signal CODE_SEL is disabled, that is, during the enable period of the output control signal OUT. The second code selection section 436 may output the signal NCODE_ODT<0:5> obtained by decoding the pull-down impedance control code N_ODT<0:2> for termination, as the pull-down impedance control code NCODE_S<0:5> in response to the signal with high level ('1').

Referring to FIG. 9B, there is shown a case where the termination control signal ODTEN is enabled.

The first termination enable signal generation unit 410 and the second termination enable signal generation unit 420 may enable and output the first termination enable signal DQ_ODTEN and the second termination enable signal DQS_ODTEN, respectively, when the training control signal CKECAL is enabled.

The select signal generation section 432 enables the select signal CODE_SEL according to the first termination enable signal DQ_ODTEN. According to this fact, the first code selection section 434 may output the signal NCODE_ODT<0:5> obtained by decoding the pull-down impedance control code N_ODT<0:2> for termination, as the pull-down impedance control code NCODE<0:5>. Thereafter, the select signal generation section 432 disables the select signal CODE_SEL when the output control signal OUT is enabled. According to this fact, the first code selection section 434 may output the signal NCODE_RD<0:5> obtained by decoding the pull-down impedance control code N_RD<0:2> for read operation, as the pull-down impedance control code NCODE<0:5>. For reference, the second code selection section 436 may output the signal NCODE_ODT<0:5> obtained by decoding the pull-down impedance control code N_ODT<0:2> for termination, as the pull-down impedance control code NCODE_S<0:5>.

Although not shown in the drawing, in the case where the termination control signal ODTEN is disabled, as the select signal CODE_SEL is always disabled, the first code selection section 434 may output the signal NCODE_RD<0:5> obtained by decoding the pull-down impedance control code N_RD<0:2> for read operation, as the pull-down impedance control code NCODE<0:5>.

Figure 10:
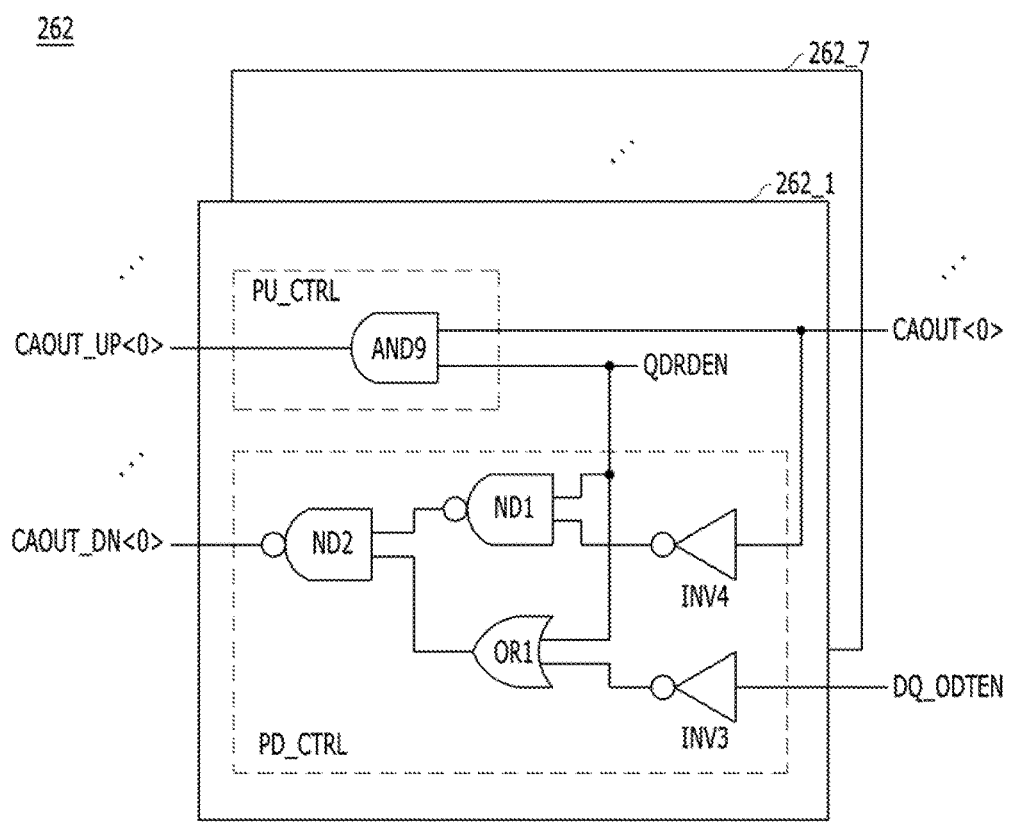
FIG. 10 is a detailed circuit diagram illustrating a first driver control unit shown in FIG. 3, in accordance to an embodiment of the present invention.

FIG. 10 is a detailed circuit diagram illustrating the first driver control unit 262 shown in FIG. 3, in accordance to an embodiment of the present invention.

Referring to FIG. 10, the first driver control unit 262 may be configured by a plurality of unit driver control sections 262_1 to 262_7 respectively corresponding to the respective bits of the training signals CAOUT<0:5, 7>. Since the plurality of unit driver control sections 262_1 to 262_7 have the same configuration, descriptions will be made by taking the first unit driver control section 262_1 as an example.

The first unit driver control section 262_1 may include a pull-up control part PU_CTRL which drives a first pull-up training signal CAOUT_UP<0> and a pull-down control part PD_CTRL which drives a first pull-down training signal CAOUT_DN<0>.

The pull-up control part PU_CTRL may drive a first training signal CAOUT<0> as the first pull-up training signal CAOUT_UP<0> according to the driving control signal QDRDEN. The pull-up control part PU_CTRL may drive the first training signal CAOUT<0> as the first pull-up training signal CAOUT_UP<0> when the driving control signal QDRDEN is enabled. In an embodiment of the present disclosure, the pull-up control part PU_CTRL may be realized by an AND gate AND9 which receives the driving control signal QDRDEN and the first training signal CAOUT<0> and outputs the first pull-up training signal CAOUT_UP<0>.

The pull-down control part PD_CTRL may drive the first training signal CAOUT<0> as the first pull-down training signal CAOUT_DN<0> according to the driving control signal QDRDEN and the first termination enable signal DQ_ODTEN. The pull-down control part PD_CTRL may drive the first pull-down training signal CAOUT_DN<0> according to the first termination enable signal DQ_ODTEN when the driving control signal QDRDEN is disabled. The pull-down control part PD_CTRL may drive the inverted signal of the first training signal CAOUT<0> as the first pull-down training signal CAOUT_DN<0> regardless of the first termination enable signal DQ_ODTEN when the driving control signal QDRDEN is enabled.

In an embodiment, the pull-down control part PD_CTRL may include a first inverter INV3, a second inverter INV4, an OR gate OR1, a first NAND gate ND1 and a second NAND gate ND2. The first inverter INV3 inverts the first termination enable signal DQ_ODTEN. The OR gate OR1 receives the output of the first inverter INV3 and the driving control signal QDRDEN. The second inverter INV4 inverts the first training signal CAOUT<0>. The first NAND gate ND1 receives the output of the second inverter INV4 and the driving control signal QDRDEN. The second NAND gate ND2 receives the output of the OR gate OR1 and the output of the first NAND gate ND1 and outputs the first pull-down training signal CAOUT_DN<0>.

Hereinbelow, the operations of the pull-up control part PU_CTRL and the pull-down control part PD_CTRL will be described.

If the driving control signal QDRDEN is disabled, the pull-up control part PU_CTRL may output the first pull-up training signal CAOUT_UP<0> by sticking it to a low logic level, and the pull-down control part PD_CTRL may drive the first pull-down training signal CAOUT_DN<0> according to the first termination enable signal DQ_ODTEN. At this time, if the first termination enable signal DQ_ODTEN is disabled, the pull-down control part PD_CTRL may output the first pull-down training signal CAOUT_DN<0> by sticking it to a low logic level, thereby driving the DQ pad to a high impedance (high-Z) state. If the first termination enable signal DQ_ODTEN is enabled, the pull-down control part PD_CTRL may output the first pull-down training signal CAOUT_DN<0> by sticking it to a high logic level, thereby pull-down terminating the DQ pad.

Conversely, if the driving control signal QDRDEN is enabled, the pull-up control part PU_CTRL may drive the first training signal CAOUT<0> as the first pull-up training signal CAOUT_UP<0>, and the pull-down control part PD_CTRL may drive the inverted signal of the first training signal CAOUT<0> as the first pull-down training signal CAOUT_DN<0>, by which the normal data output operation may be performed.

These descriptions may be summarized as in the following Table 1.

TABLE 1

| QDRDEN | 0 | | 1 | |
|---|---|---|---|---|
| DQ_ODTEN | 0 | 1 | 0 | 1 |
| CAOUT_UP | 0 | 0 | CAOUT | |
| CAOUT_DN | 0 | 1 | /CAOUT | |
| DQ PAD state | High-Z | Termination | data output operation | |

As described above, in the training mode, the first driver control unit 262 according to the embodiment of the present disclosure may not perform the termination operation during the enable period of the driving control signal QDRDEN, that is, during a period in which the training signals CAOUT<0:5, 7> are outputted to the DQ pads, even though the first termination enable signal DQ_ODTEN is enabled, and may drive the pull-up training signals CAOUT_UP<0:5, 7> and the pull-down training signals CAOUT_DN<0:5, 7> such that the normal data output operation is performed.

Figure 11:
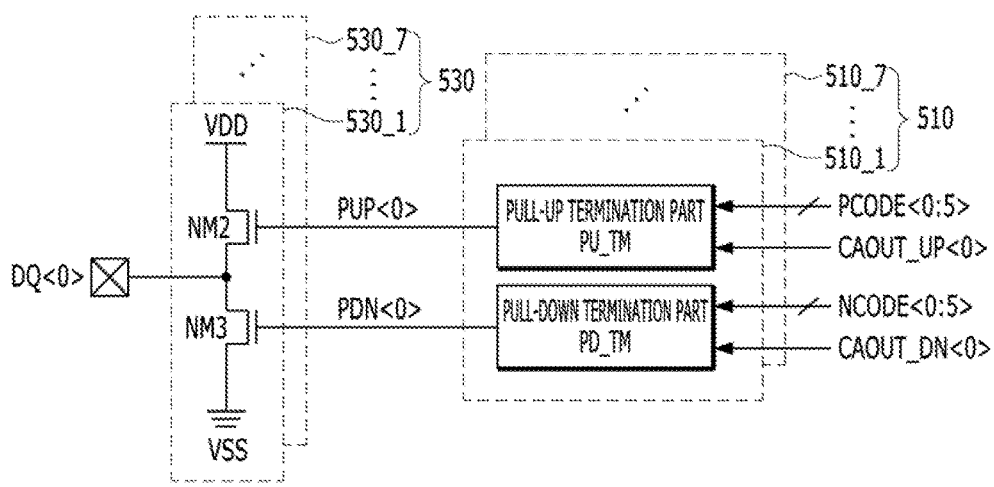
FIG. 11 is a detailed configuration diagram illustrating a first output driver shown in FIG. 3, in accordance to an embodiment of the present invention.

FIG. 11 is a detailed configuration diagram illustrating the first output driver 266 shown in FIG. 3, in accordance to an embodiment of the present invention.

Referring to FIG. 11, the first output driver 266 may include a pre-driving section 510 and a main driving section 530. The pre-driving section 510 and the main driving section 530 may be respectively configured by a plurality of pre-drivers 510_1 to 510_7 and a plurality of main drivers 530_1 to 530_7 corresponding to the respective bits of the training signals CAOUT<0:5, 7>, respectively. Since the pluralities of drivers have the same configurations, descriptions will be made by taking a first pre-driver 510_1 and a first main driver 530_1 as an example.

The first pre-driver 510_1 may include a pull-up termination part PU_TM and a pull-down termination part PD_TM. The pull-up termination part PU_TM may control pull-up impedance according to the pull-up impedance control code PCODE<0:5>, and receive the first pull-up training signal CAOUT_UP<0> and output a first pull-up signal PUP<0>. The pull-down termination part PD_TM may control pull-down impedance according to the pull-down impedance control code NCODE<0:5>, and receive the first pull-down training signal CAOUT_DN<0> and output a first pull-down signal PDN<0>. In an embodiment, the pull-up termination part PU_TM and the pull-down termination part PD_TM may include a plurality of transistors (not shown) which are coupled in parallel, and the respective transistors may receive the respective bits of the pull-up impedance control code PCODE<0:5> and the pull-down impedance control code NCODE<0:5> through the gates thereof.

The first main driver 530_1 may include a first NMOS transistor NM2 and a second NMOS transistor NM3 which are coupled in series between the terminal of the power supply voltage VDD and the terminal of the ground voltage VSS and receive the first pull-up signal PUP<0> and the first pull-down signal PDN<0>, respectively, through the gates thereof. The common node of the first NMOS transistor NM2 and the second NMOS transistor NM3 may be coupled with the first DQ pad DQ<0>.

As described above, the first output driver 266 may control output impedance according to the pull-up impedance control code PCODE<0:5> and the pull-down impedance control code NCODE<0:5>, and receive the pull-up training signals CAOUT_UP<0:5, 7> and the pull-down training signals CAOUT_DN<0:5, 7> and output the second data signal CBT_OUT<0:5> and the strobe signal to the DQ pads.

Hereafter, the operation of the semiconductor system in accordance with an embodiment of the present disclosure will be described with reference to FIGS. 2 to 12B.

Figure 12A:
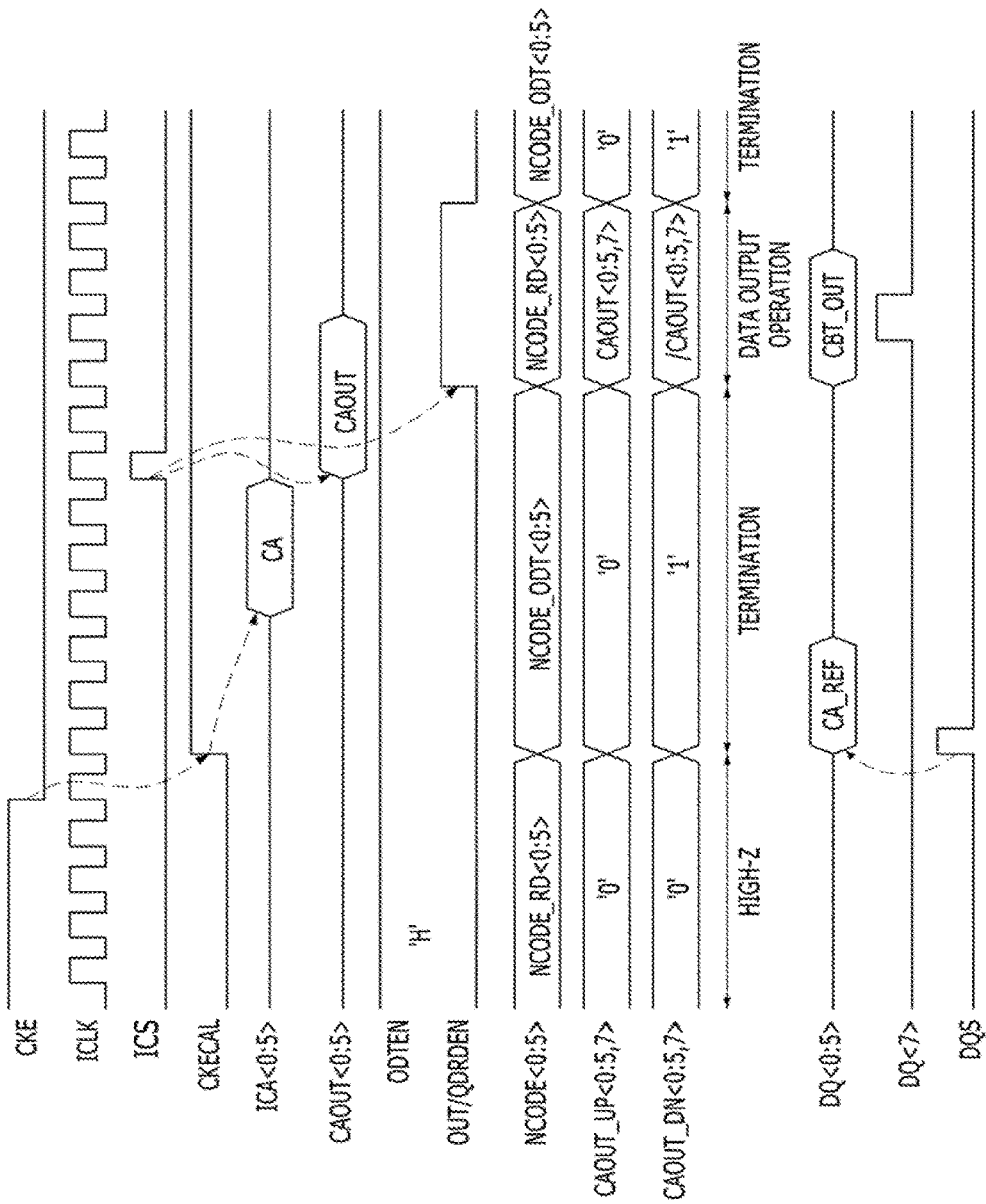
FIGS. 12A and 12B are timing diagrams illustrating an operation of a semiconductor system, in accordance with an embodiment of the present invention.
Figure 12B:
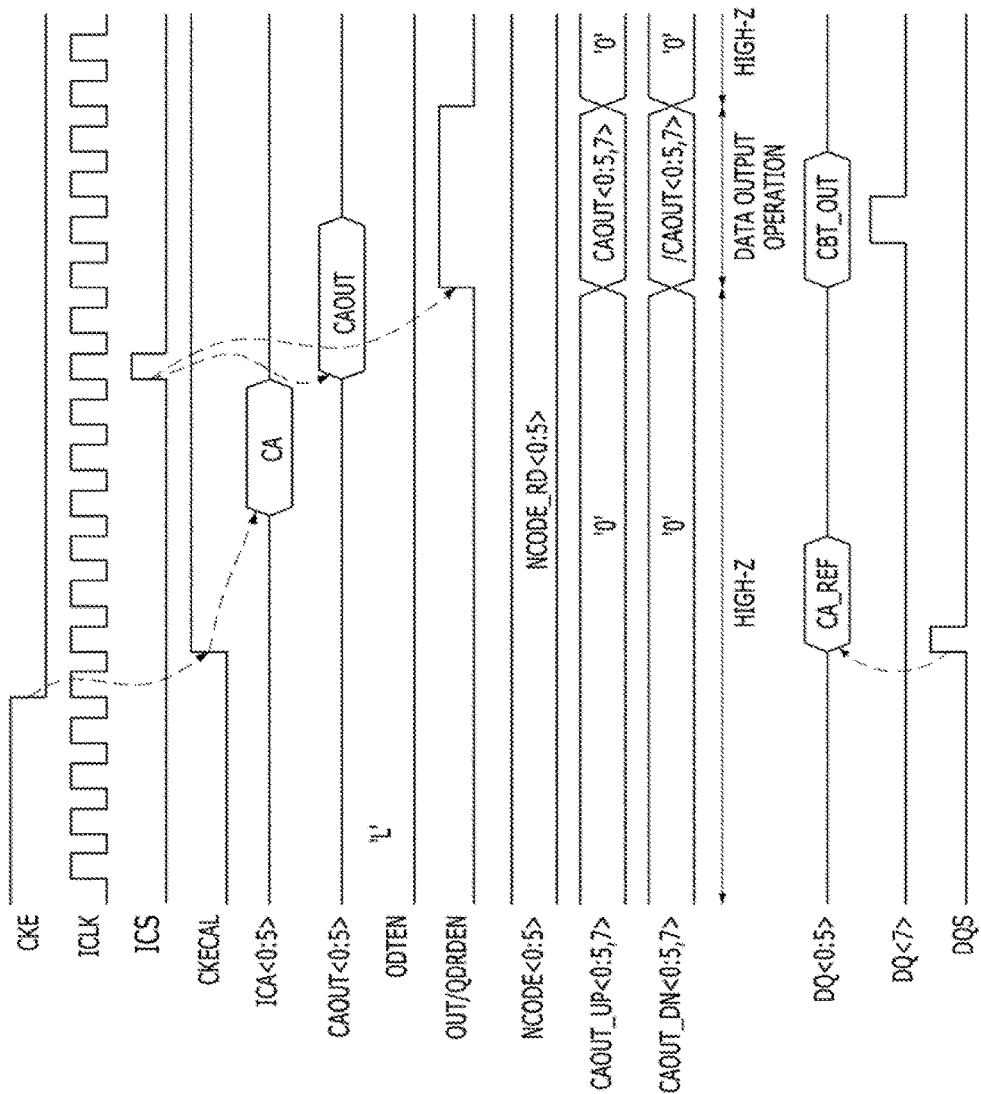

FIGS. 12A and 12B are timing diagrams illustrating an operation of a semiconductor system in accordance with an embodiment of the present invention.

Referring to FIG. 12A, there is shown a case where the termination control signal ODTEN is enabled to a high logic level 'H'.

First, before the training control signal CKECAL is enabled, the termination control block 250 outputs the signal NCODE_RD<0:5> obtained by decoding the pull-down impedance control code N_RD<0:2> for read operation, as the pull-down impedance control code NCODE<0:5>, and the first driver control unit 262 of the output driving block 260 outputs the pull-up training signals CAOUT_UP<0:5, 7> and the pull-down training signals CAOUT_DN<0:5, 7> to the low logic levels '0'. Accordingly, the first output driver 266 may drive the DQ pads to the high impedance (high-Z) state.

Thereafter, the training control signal generation unit 228 enables the training control signal CKECAL in response to the clock enable signal CKE. Accordingly, the termination control block 250 outputs the signal NCODE_ODT<0:5> obtained by decoding the pull-down impedance control code N_ODT<0:2> for termination, as the pull-down impedance control code NCODE<0:5>, and the first driver control unit 262 of the output driving block 260 outputs the pull-up training signals CAOUT_UP<0:5, 7> to the low logic level '0' and outputs the pull-down training signals CAOUT_DN<0:5, 7> to the high logic level '1'. Accordingly, the first output driver 266 may pull-down terminate the DQ pads.

The reference voltage generation block 210 of the semiconductor device 100 controls the level of the reference voltage VREF_CA<0:6> in response to the first data signal CA_REF<0:6> transferred through the data bus 111 from the controller 110. The second input buffer 214 may output the internal strobe signal IDQS by buffering the strobe signal inputted through the DQS pad, and the first input buffer 212 may transfer the first data signal CA_REF<0:6> transferred through the first to sixth DQ pads DQ<0:5>, to the reference voltage generation block 210, in response to the internal strobe signal IDQS.

Then, the first buffer unit 222 of the training block 220 buffers the clock signal CLK and outputs the internal clock signal ICLK, and outputs the internal chip select signal ICS by synchronizing the chip select signal CS with the rising edge of the internal clock signal ICLK. The second buffer unit 224 of the training block 220 buffers the command/address signal CA<0:5> based on the reference voltage VREF_CA<0:6>, and outputs the internal command/address signal ICA<0:5> in synchronization with the internal clock signal ICLK. The latch unit 226 latches the internal command/address signal ICA<0:5> according to the internal chip select signal ICS, and outputs the training signal CAOUT<0:5>.

The timing control block 230 receives the internal chip select signal ICS and the training control signal CKECAL and generates the cycle signal OSC_OUT, and generates the first and second output timing signals OUT_EN and OUT_DIS and the first and second strobe timing signals DQ7_EN and DQ7_DIS which are enabled at specified times, based on the cycle signal OSC_OUT. The output control block 240 generates the output control signal OUT of which enable period is determined according to the first and second output timing signals OUT_EN and OUT_DIS, and outputs the output control signal OUT as the driving control signal QDRDEN. The strobe signal generation unit 246 may generate the training signal CAOUT<7> according to the first and second strobe timing signals DQ7_EN and DQ7_DIS.

During the enable period of the driving control signal QDRDEN, the termination control block 250 outputs the signal NCODE_RD<0:5> obtained by decoding the pull-down impedance control code N_RD<0:2> for read operation, as the pull-down impedance control code NCODE<0:5>, and the first driver control unit 262 of the output driving block 260 outputs the training signals CAOUT<0:5, 7> as the pull-up training signals CAOUT_UP<0:5, 7> and outputs the inverted signals of the training signals CAOUT<0:5, 7> as the pull-down training signals CAOUT_DN<0:5, 7>. Accordingly, the first output driver 266 controls output impedance according to the pull-up impedance control code PCODE<0:5> and the pull-down impedance control code NCODE<0:5>, and outputs the second data signal CBT_OUT<0:5> and the strobe signal to the DQ pads DQ<0:5, 7>, by which the normal data output operation may be performed.

Referring to FIG. 12B, there is shown a case where the termination control signal ODTEN is disabled to a low logic level 'L'.

First, before the training control signal CKECAL is enabled, the termination control block 250 outputs the signal NCODE_RD<0:5> obtained by decoding the pull-down impedance control code N_RD<0:2> for read operation, as the pull-down impedance control code NCODE<0:5>, and the first driver control unit 262 of the output driving block 260 outputs the pull-up training signals CAOUT_UP<0:5, 7> and the pull-down training signals CAOUT_DN<0:5, 7> to the low logic levels '0'. Accordingly, the first output driver 266 may drive the DQ pads to the high impedance (high-Z) state.

Thereafter, the training control signal generation unit 228 enables the training control signal CKECAL in response to the clock enable signal CKE. At this time, since the termination control signal ODTEN is continuously retained in the disabled state, the DQ pads continuously retain the high impedance (high-Z) state.

The reference voltage generation block 210 of the semiconductor device 100 controls the level of the reference voltage VREF_CA<0:6> in response to the first data signal CA_REF<0:6> transferred through the data bus 111 from the controller 110. Thereafter, the training block 220 buffers the command/address signal CA<0:5>, based on the reference voltage VREF_CA<0:6>, and outputs the internal command/address signal ICA<0:5>. The training block 220 latches the internal command/address signal ICA<0:5> according to the internal chip select signal ICS and outputs the training signal CAOUT<0:5>.

The timing control block 230 generates the first and second output timing signals OUT_EN and OUT_DIS and the first and second strobe timing signals DQ7_EN and DQ7_DIS, according to the internal chip select signal ICS and the training control signal CKECAL. The output control block 240 generates the output control signal OUT of which enable period is determined according to the first and second output timing signals OUT_EN and OUT_DIS, and outputs the output control signal OUT as the driving control signal QDRDEN. The strobe signal generation unit 246 may generate the training signal CAOUT<7> according to the first and second strobe timing signals DQ7_EN and DQ7_DIS.

During the enable period of the driving control signal QDRDEN, the termination control block 250 may output the signal NCODE_RD<0:5> obtained by decoding the pull-down impedance control code N_RD<0:2> for read operation, as the pull-down impedance control code NCODE<0:5>, and the first driver control unit 262 of the output driving block 260 may output the training signals CAOUT<0:5, 7> as the pull-up training signals CAOUT_UP<0:5, 7> and outputs the inverted signals of the training signals CAOUT<0:5, 7> as the pull-down training signals CAOUT_DN<0:5, 7>. Accordingly, the first output driver 266 controls output impedance according to the pull-up impedance control code PCODE<0:5> and the pull-down impedance control code NCODE<0:5>, and outputs the second data signal CBT_OUT<0:5> and the strobe signal to the DQ pads DQ<0:5, 7>, by which the normal data output operation may be performed.

As described above, according to an embodiment of the present disclosure, in a training mode, during a period in which a training signal CAOUT<0:5> is outputted, even though a termination control signal ODTEN is enabled, the output driving block 260 of the semiconductor device 100 does not perform the termination operation and performs instead a normal data output operation by driving the training signals CAOUT<0:5> and outputting them to the DQ pads.

In the above descriptions, consideration was made for the case where the DQS pad is used in only an input mode in which the strobe signal is inputted through the strobe signal line 112 (see FIG. 2). That is to say, because the DQS pad of FIG. 3 is used in only the input mode in which the strobe signal is inputted through the strobe signal line 112, the second driver control unit 264 may not be controlled by the driving control signal QDRDEN in an output mode and may control the second output driver 268 to always perform the termination operation for the DQS pad, when the second termination enable signal DQS_ODTEN is enabled.

In the following embodiment, descriptions will be made for the case where a DQS pad is used in both an input mode and an output mode.

Figure 13:
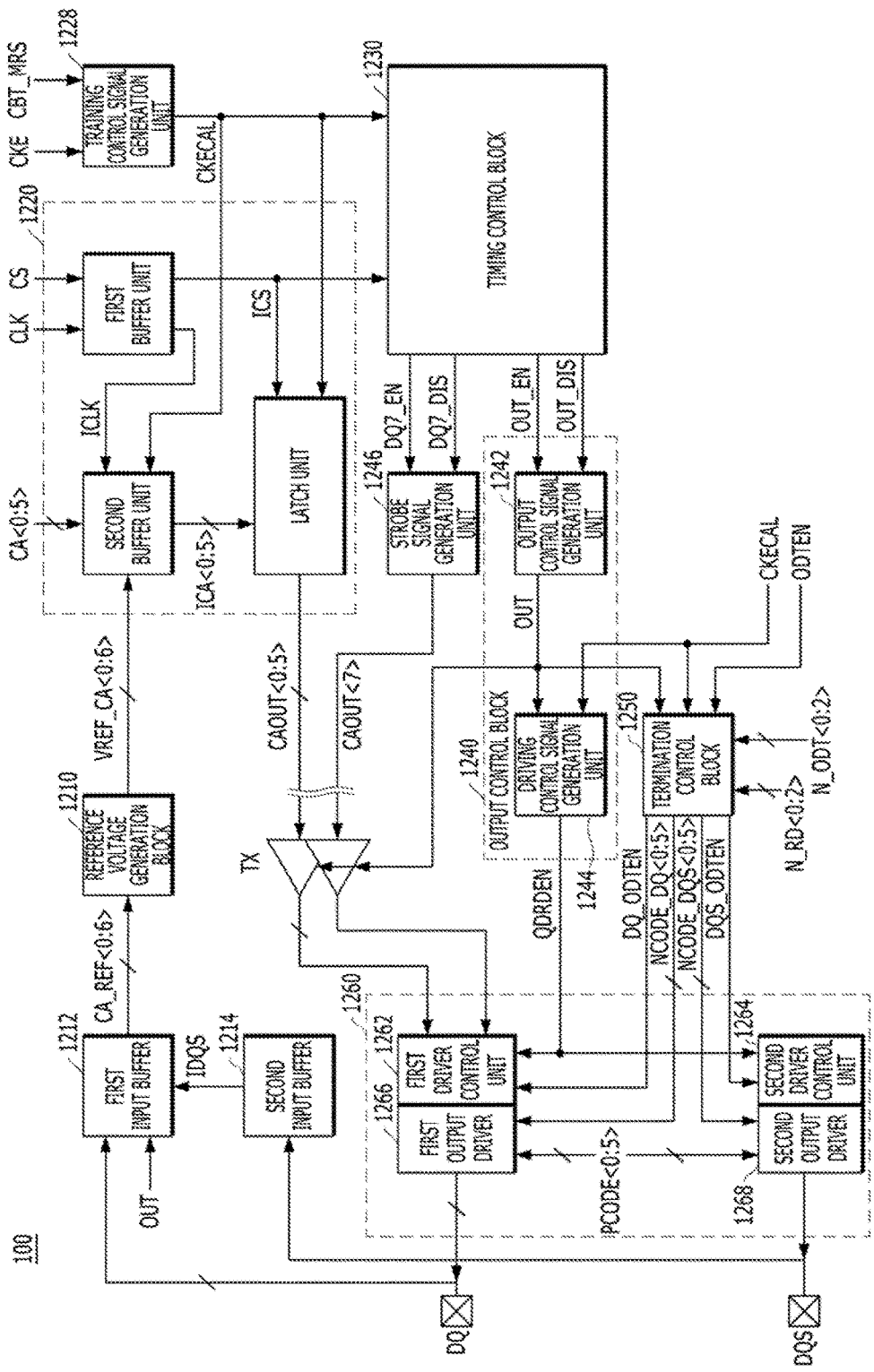
FIG. 13 is a detailed configuration diagram illustrating a semiconductor device, in accordance with another embodiment of the present invention.

FIG. 13 is a detailed configuration diagram illustrating the semiconductor device 100 in accordance with another embodiment of the present invention.

Referring to FIG. 13, the semiconductor device 100 may include a reference voltage generation block 1210, a training block 1220, a timing control block 1230, an output control block 1240, a termination control block 1250, and an output driving block 1260. The semiconductor device 100 may further include a first input buffer 1212, a second input buffer 1214, a training control signal generation unit 1228, and a strobe signal generation unit 1246. For avoiding unnecessary duplication, descriptions for components among the components of FIG. 13, overlapping with the components of FIG. 3, may be omitted herein.

The termination control block 1250 may output a termination signal according to a training control signal CKECAL and a termination control signal ODTEN, and control the termination signal such that a termination operation is not performed during the enable period of an output control signal OUT. The termination signal may include a pull-up impedance control code PCODE<0:5> and/or pull-down impedance control codes NCODE_DQ<0:5> and NCODE_DQS<0:5>.

In detail, the termination control block 1250 outputs a first termination enable signal DQ_ODTEN and a second termination enable signal DQS_ODTEN according to the training control signal CKECAL and the termination control signal ODTEN. Also, the termination control block 1250 may output a first pull-down impedance control code NCODE_DQ<0:5> and a second pull-down impedance control code NCODE_DQS<0:5> according to the training control signal CKECAL and the termination control signal ODTEN. During the enable period of the output control signal OUT, the termination control block 1250 may output a signal obtained by decoding not a pull-down impedance control code N_ODT<0:2> for termination but a pull-down impedance control code N_RD<0:2> for read operation, as the first pull-down impedance control code NCODE_DQ<0:5> and the second pull-down impedance control code NCODE_DQS<0:5>.

The output driving block 1260 may include a first driver control unit 1262, a second driver control unit 1264, a first output driver 1266, and a second output driver 1268.

Since the configurations and operations of the first driver control unit 1262 and the first output driver 1266 of FIG. 13 are substantially the same as the first driver control unit 262 and the first output driver 266 of FIG. 3, detailed descriptions thereof will be omitted herein. The second driver control unit 1264 may drive an internal strobe signal IDQS inputted thereto, according to the second termination enable signal DQS_ODTEN and the driving control signal QDRDEN. The second output driver 1268 may control output impedance according to the pull-up impedance control code PCODE<0:5> and the second pull-down impedance control code NCODE_DQS<0:5>, and drive a DQS pad by receiving the signal transferred through the second driver control unit 1264 and output a strobe signal through the strobe signal line 112 (see FIG. 2). Meanwhile, the detailed configurations of the second driver control unit 1264 and the second output driver 1268 may be implemented by the same configurations as the first unit driver control section 262_1 of FIG. 10 and the first pre-driver 510_1 and the first main driver 530_1 of FIG. 11.

As described above, according to another embodiment of the present disclosure, during a period in which a training signal CAOUT<0:5> is outputted in a training mode, even though a termination control signal ODTEN is enabled, the output driving block 1260 of the semiconductor device 100 does perform the termination operation and performs a normal data output operation by driving the training signals CAOUT<0:5> and the internal strobe signal IDQS and outputting them to DQ pads and the DQS pad.

Figure 14:
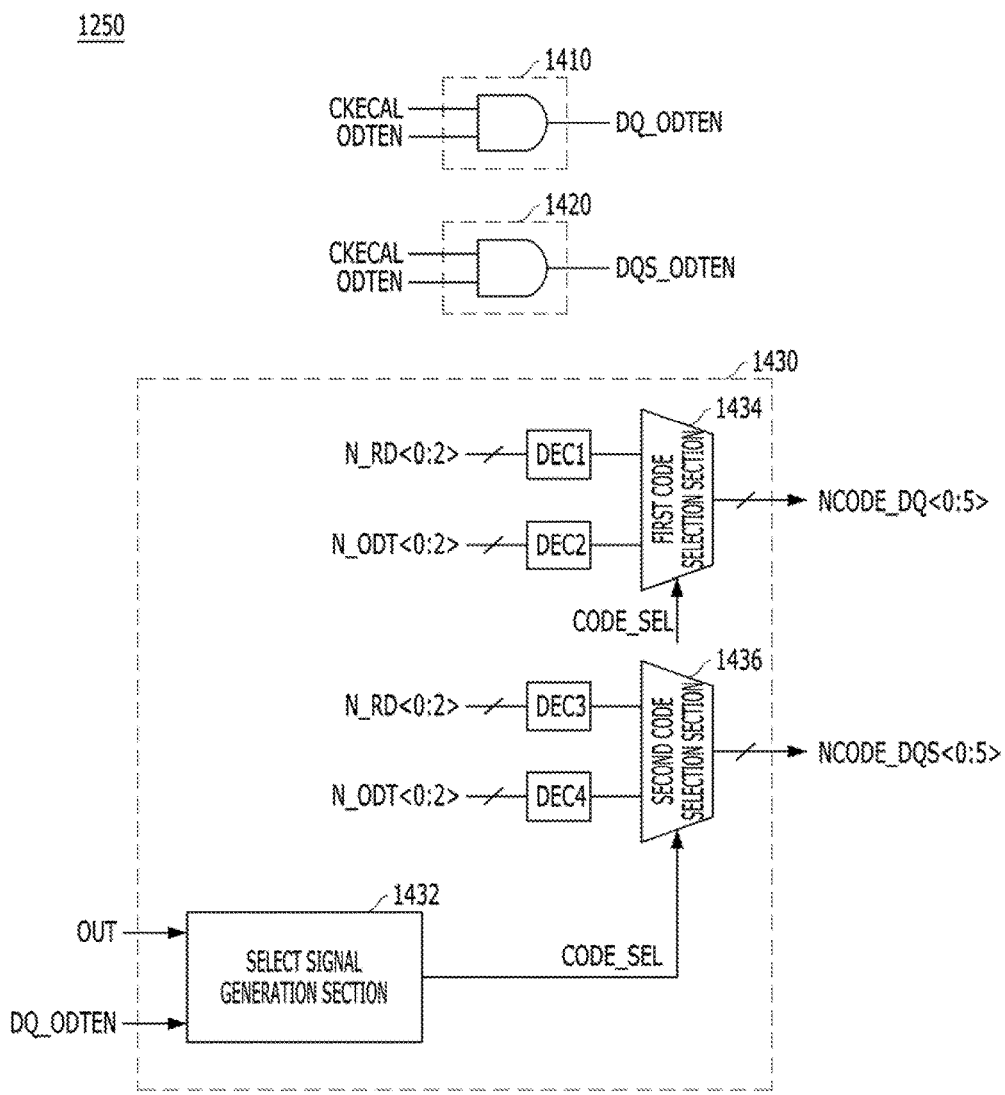
FIG. 14 is a detailed circuit diagram illustrating a termination control block shown in FIG. 13.

FIG. 14 is a detailed circuit diagram illustrating the termination control block 1250 shown in FIG. 13, according to an embodiment of the present invention.

Referring to FIG. 14, the termination control block 1250 may include a first termination enable signal generation unit 1410, a second termination enable signal generation unit 1420, and an impedance control code generation unit 1430. The impedance control code generation unit 1430 may include a select signal generation section 1432, a first code selection section 1434, and a second code selection section 1436.

Since the components of FIG. 14 are substantially the same as the components of FIG. 9A, detailed descriptions thereof will be omitted herein.

The second code selection section 1436 may output the second pull-down impedance control code NCODE_DQS<0:5> by selecting the signal obtained by decoding the pull-down impedance control code N_RD<0:2> for read operation or the signal obtained by decoding the pull-down impedance control code N_ODT<0:2> for termination, in response to a select signal CODE_SEL.

According to an embodiment of the present disclosure, the level of a reference voltage may be set internally, training for an external signal including a command and an address may be performed based on the set level of the reference voltage, and a termination operation may be interrupted in a period in which the external signal is outputted, whereby it is possible to control the termination operation in a training mode.

Further, according to an embodiment of the present disclosure, by supporting an ODT operation in an X8 CBT mode in which an input operation of a reference value (CA_REF) of a command/address (CMD/ADDR) signal and an output operation of a CBT result value (CBT_OUT) are performed through using the same pads, it is possible to precisely perform a training operation.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors described as an example in the above embodiment should be differently realized according to the polarities of the signals inputted thereto.

What is claimed is:

1. A semiconductor device comprising:
   a reference voltage generation block suitable for determining a level of a reference voltage in response to a first data signal;
   a training block suitable for, in a training mode, buffering an external signal based on the reference voltage and outputting a training signal by latching a buffered external signal in response to a chip select signal;
   a timing control block suitable for, in the training mode, generating a cycle signal by receiving the chip select signal and generating an output timing signal which is enabled at a specified time, based on the cycle signal;
   an output control block suitable for, in the training mode, generating an output control signal of which enable period is determined according to the output timing signal;
   a termination control block suitable for, in the training mode, outputting a termination signal according to a termination control signal and controlling the termination signal such that a termination operation is not performed during the enable period of the output control signal; and
   an output driving block suitable for controlling output impedance according to the termination signal and outputting a second data signal by driving the training signal according to the output control signal.

2. The semiconductor device of claim 1, wherein the external signal includes a command/address (CMD/ADDR) signal which includes at least one of a command and an address.

3. The semiconductor device of claim 1, wherein the first data signal and the second data signal are inputted and outputted through the same data pads in the training mode.

4. The semiconductor device of claim 1, wherein the training block comprises:
   a first buffer unit suitable for outputting the chip select signal as an internal chip select signal in synchronization with one of a rising edge and a falling edge of an internal clock signal;
   a second buffer unit suitable for being enabled in response to a training control signal which notifies entry to the training mode, and generating an internal signal by buffering the external signal based on the reference voltage; and a latch unit suitable for being enabled in response to the training control signal, and outputting the training signal by latching the internal signal according to the internal chip select signal.

5. The semiconductor device of claim 4, further comprising:
   a training control signal generation unit suitable for generating the training control signal in response to a training mode signal transferred from a mode register (MRS) and a clock enable signal.

6. The semiconductor device of claim 1, wherein, in the training mode, the timing control block generates the cycle signal according to the chip select signal, generates a plurality of counting signals by counting the cycle signal, and generates the output timing signal and a strobe timing signal which are enabled at an enable time of at least one signal of the cycle signal and the plurality of counting signals.

7. The semiconductor device of claim 6, further comprising:
   a strobe signal generation unit suitable for generating a strobe signal of which enable period is determined according to the strobe timing signal.

8. The semiconductor device of claim 7, wherein the output driving block outputs the strobe signal to one among data pads while outputting the second data signal by driving the training signal according to the output control signal.

9. The semiconductor device of claim 1, wherein the timing control block comprises:
   a timing control signal generation unit suitable for generating an enable period signal and an initialization signal in response to the chip select signal and the output timing signal in the training mode;
   an oscillator suitable for generating the cycle signal which cyclically toggles during an enable period of the enable period signal;
   a counter suitable for being initialized according to the initialization signal, and generating the plurality of counting signals which have different cycles, by counting the cycle signal; and
   a timing signal generation unit suitable for generating the output timing signal and the strobe timing signal which are enabled at the enable time of at least one signal of the cycle signal and the plurality of counting signals.

10. The semiconductor device of claim 9, wherein the timing control signal generation unit comprises:
    an initialization signal generation section suitable for generating the initialization signal which is enabled in response to the chip select signal, when the training control signal is enabled; and
    an enable period signal generation section suitable for generating the enable period signal which is enabled in response to the chip select signal and is disabled in response to the output timing signal, when the training control signal is enabled.

11. The semiconductor device of claim 1, wherein the termination control block comprises:
    a termination enable signal generation unit suitable for outputting a termination enable signal when the training control signal is enabled; and
    an impedance control code generation unit suitable for outputting an impedance control code for termination, as the termination signal, according to the termination enable signal, and outputting an impedance control code for read operation, as the termination signal, during the enable period of the output control signal.

12. The semiconductor device of claim 11, wherein the impedance control code generation unit comprises:

a select signal generation section suitable for generating a select signal which is enabled according to the termination enable signal and is disabled when the output control signal is enabled; and a code selection section suitable for outputting the termination signal by selecting the impedance control code for read operation or the impedance control code for termination in response to the select signal.

13. The semiconductor device of claim 11, wherein the output driving block comprises:

a driver control unit suitable for driving the training signal as a pull-up training signal and a pull-down training signal according to the termination enable signal and the output control signal; and an output driver suitable for controlling output impedance according to the termination signal, and outputting the second data signal to data (DQ) pads by receiving the pull-up training signal and the pull-down training signal.

14. The semiconductor device of claim 13, wherein the driver control unit drives the pull-up training signal and the pull-down training signal according to the termination enable signal, when the output control signal is disabled, and wherein the driver control unit outputs the training signal as the pull-up training signal and outputs an inverted signal of the training signal as the pull-down training signal, regardless of the termination enable signal, when the output control signal is enabled.

15. The semiconductor device of claim 1, further comprising:

a first input buffer suitable for outputting the first data signal by buffering data inputted through data (DQ) pads, in response to an internal strobe signal; and a second input buffer suitable for outputting the internal strobe signal by buffering a strobe signal inputted through a data strobe (DQS) pad.

* * * * *